United States Patent
Byun et al.

(10) Patent No.: US 11,296,719 B2
(45) Date of Patent: Apr. 5, 2022

(54) FRONT-END CIRCUIT PERFORMING ANALOG-TO-DIGITAL CONVERSION AND TOUCH PROCESSING CIRCUIT INCLUDING THE SAME

(71) Applicant: Samsung Electronics Co., Ltd., Suwon-si (KR)

(72) Inventors: Sanho Byun, Suwon-si (KR); Minsung Kim, Suwon-si (KR); Jungmoon Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 16/738,077

(22) Filed: Jan. 9, 2020

(65) Prior Publication Data

US 2020/0373936 A1    Nov. 26, 2020

(30) Foreign Application Priority Data

May 21, 2019    (KR) .......................... 10-2019-0059700

(51) Int. Cl.
*G06F 3/044* (2006.01)
*H03M 1/44* (2006.01)
*H03M 1/36* (2006.01)

(52) U.S. Cl.
CPC ............ *H03M 1/442* (2013.01); *G06F 3/044* (2013.01); *H03M 1/361* (2013.01)

(58) Field of Classification Search
None
See application file for complete search history.

(56) References Cited

U.S. PATENT DOCUMENTS

| | | |
|---|---|---|
| 6,847,319 B1 | 1/2005 | Stockstad |
| 7,724,063 B1 | 5/2010 | Chang et al. |
| 7,924,204 B2 | 4/2011 | Chang et al. |
| 8,405,538 B2 | 3/2013 | Makihara et al. |
| 8,581,171 B2 | 11/2013 | Kawahito et al. |

(Continued)

FOREIGN PATENT DOCUMENTS

| | | |
|---|---|---|
| JP | 2011-034176 A | 2/2011 |
| KR | 1020170005286 | 1/2017 |

OTHER PUBLICATIONS

Extended European Search Report dated October 9. 2020 for EP Patent Application No. 20175573.3.

(Continued)

*Primary Examiner* — Nitin Patel
*Assistant Examiner* — Amen W Bogale
(74) *Attorney, Agent, or Firm* — Harness, Dickey & Pierce, P.L.C.

(57) ABSTRACT

A touch processing circuit includes: a front-end circuit including an amplifier, a first capacitor, a second capacitor, a third capacitor, and a plurality of switches each having two ends that are selectively connected each other, the front-end circuit being configured to process an input signal varying according to a touch; and a controller controlling the plurality of switches so that the front-end circuit is configured as a first circuit that accumulates deviation of the input signal between a first phase and a second phase during an integration period and a second circuit that converts the accumulated deviation into a digital signal during a conversion period.

19 Claims, 21 Drawing Sheets

(56) References Cited

U.S. PATENT DOCUMENTS

| | | | |
|---|---|---|---|
| 9,235,300 B2 | 1/2016 | Angelini et al. | |
| 9,444,489 B2* | 9/2016 | Roh | H03M 3/496 |
| 9,973,199 B2 | 5/2018 | Byun et al. | |
| 10,069,507 B1 | 9/2018 | Hoseini et al. | |
| 2007/0001893 A1 | 1/2007 | Shinohara | |
| 2010/0110040 A1 | 5/2010 | Kim et al. | |
| 2011/0240832 A1* | 10/2011 | Kawahito | H04N 5/3745 |
| | | | 250/208.1 |
| 2011/0279148 A1* | 11/2011 | Watanabe | G11C 27/026 |
| | | | 327/96 |
| 2013/0038481 A1* | 2/2013 | Pedersen | H03M 1/0604 |
| | | | 341/131 |
| 2013/0249825 A1* | 9/2013 | Kang | G06F 3/03547 |
| | | | 345/173 |
| 2014/0292375 A1* | 10/2014 | Angelini | G03G 7/00 |
| | | | 327/94 |
| 2014/0298921 A1 | 10/2014 | Surapaneni et al. | |
| 2015/0123829 A1* | 5/2015 | Kim | G06G 7/184 |
| | | | 341/143 |
| 2015/0145801 A1* | 5/2015 | Angelini | G06F 3/0446 |
| | | | 345/174 |
| 2015/0311868 A1* | 10/2015 | Wan | H03G 3/002 |
| | | | 330/9 |
| 2015/0338952 A1 | 11/2015 | Shahparnia et al. | |
| 2018/0188847 A1* | 7/2018 | Srivastava | G06F 3/0446 |
| 2019/0163312 A1* | 5/2019 | Chen | G06F 3/0416 |

OTHER PUBLICATIONS

Amani, Samira, "A 15-bit Capacitance-to-Digital Converter For Position Sensing with Electrically Floating Targets," Jun. 2017, Office of Graduate Studies of The Delft University of Technology in partial fulfilment of the requirements for the degree of Master of Science.

* cited by examiner

US 11,296,719 B2

FRONT-END CIRCUIT PERFORMING ANALOG-TO-DIGITAL CONVERSION AND TOUCH PROCESSING CIRCUIT INCLUDING THE SAME

CROSS-REFERENCE TO RELATED APPLICATION

This application claims priority to Korean Patent Application No. 10-2019-0059700, filed on May 21, 2019, in the Korean Intellectual Property Office, the disclosure of which is incorporated herein in its entirety by reference.

BACKGROUND

Example embodiments of the inventive concepts relate to signal processing. For example, at least some example embodiments relate to a front-end circuit performing an analog-to-digital conversion and/or a touch processing circuit including the front-end circuit.

A touch system receiving a user input based on a touch event has been used in various applications. For example, a touch system may include a sensor array arranged on a display panel and may detect a coordinate of an object, e.g., a part of a user's body or a stylus pen, that is approximate to or in contact with the sensor array. A touch system may be used as a component for receiving a user input in a mobile application such as a mobile phone, as well as in a stationary application such as a kiosk. Accordingly, a touch system may be required to have reduced costs, e.g., reduced power consumption and reduced area, as well as to accurately detect a touch event.

SUMMARY

According to an example embodiment of the inventive concepts, provided is a signal processing for detecting a touch event, and more particularly, to a front-end circuit performing an analog-to-digital conversion and a touch processing circuit including the front-end circuit.

According to an example embodiment of the inventive concepts, a front-end circuit may be configured to process an input signal that varies according to a touch. The front-end circuit may include a plurality of switches each configured to selectively form a closed circuit; an amplifier configured to operate during an integration period, in which a deviation of the input signal between a first phase and a second phase is accumulated as an accumulated deviation, and the conversion period, in which the accumulated deviation is converted into a digital signal; a first capacitor configured to sample the input signal during the integration period and to sample an output voltage of the amplifier during the conversion period, by at least some of the plurality of switches; a second capacitor configured to provide a common mode voltage to the amplifier as a virtual ground during the integration period and to function as a feedback capacitor of the amplifier during the conversion period, by at least some of the plurality of switches; and a third capacitor configured to function as the feedback capacitor during the integration period and to sample the output voltage during the conversion period, by at least some of the plurality of switches.

According to an example embodiment of the inventive concepts, a touch processing circuit includes a front-end circuit including an amplifier, a first capacitor, a second capacitor, a third capacitor, and a plurality of switches each configured to selectively form a closed circuit, the front-end circuit being configured to process an input signal that varies according to a touch; and a controller configured to control the plurality of switches, such that the front-end circuit is configured as, a first circuit to accumulate a deviation of the input signal between a first phase and a second phase as an accumulated deviation during an integration period, and a second circuit to convert the accumulated deviation into a digital signal during a conversion period.

According to an example embodiment of the inventive concepts, a touch processing circuit configured to detect a touch based on a capacitance that varies according to the touch, the touch processing circuit including a front-end circuit including an amplifier, a first capacitor, a second capacitor, a third capacitor and a plurality of switches, the front-end circuit configured to, generate an input signal based on a variation in the capacitance, accumulate deviations of the input signal between a first phase and a second phase as an accumulated deviation during an integration period, and convert the accumulated deviation into a digital signal during a conversion period; and a controller configured to control the plurality of switches such that the amplifier, the first capacitor, the second capacitor, and the third capacitor are operating in the integration period and the conversion period.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
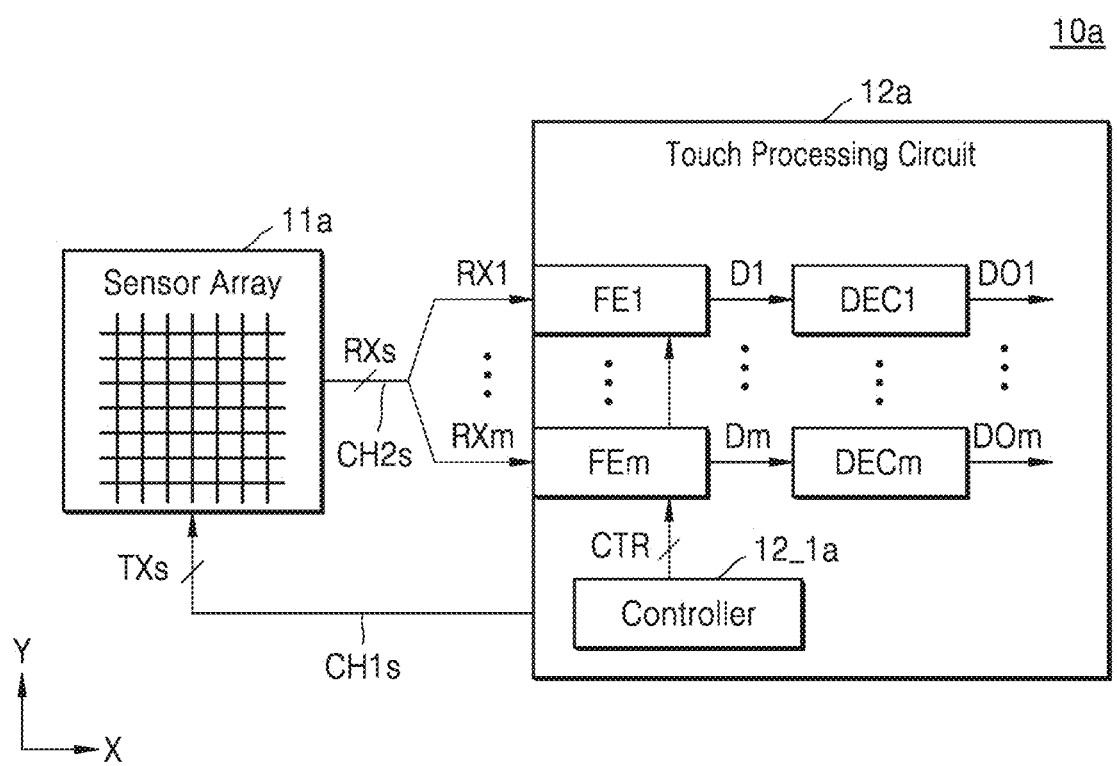
FIGS. 1A and 1B are block diagrams showing examples of a touch system according to one or more example embodiments.
Figure 1B:
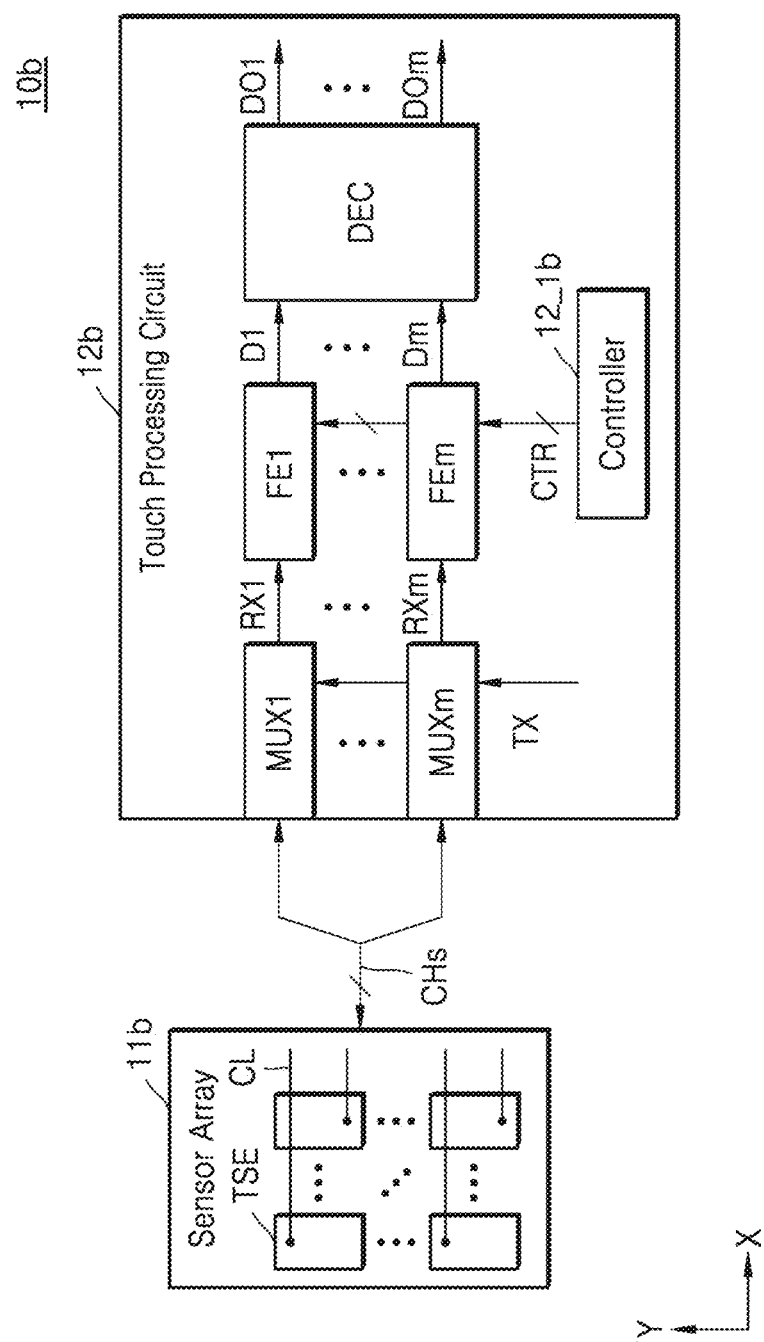

FIGS. 1A and 1B are block diagrams showing examples a touch system 10a and 10b according to one or more example embodiments. In detail, FIG. 1A is a block diagram of the touch system 10a including a sensor array 11a including electrodes that extend crossing one another, and FIG. 1B is a block diagram of the touch system 10b including a sensor array 11b having a dot structure. Hereinafter, redundant descriptions about FIGS. 1A and 1B will be omitted.

Referring to FIG. 1A, the touch system 10a may include the sensor array 11a and a touch processing circuit 12a. The touch system 10a may detect a touch (or a touch event) of an object onto the sensor array 11a. The object may denote an arbitrary object of which a touch may be sensed by the sensor array 11a. For example, the object may denote a part of user's body (e.g., a finger), an object worn or used by the user (e.g., gloves, pens, etc.), or a component of another system, which has a variable location according to an operation thereof. The touch system 10a may be used as a component for receiving an input from outside in various applications. In some example embodiments, the sensor array 11a may be arranged on a display panel, and the touch system 10a may be used to receive a user input in response to a display provided to the user on the display panel. For example, the touch system 10a may be used as a component of a stationary electronic system such as a kiosk, or a mobile electronic system such as a mobile phone. In some example embodiments, the sensor array 11a may be independently arranged on the display panel, like a touch pad, a pen tablet, a smart pad, etc. In the specification of the inventive concept, a touch or a touch event may collectively refer to that the object is proximate to the sensor array 11a, as well as, in contact with the sensor array 11a.

The sensor array 11a may include a plurality of sensors arranged on a touch area, in order to detect a location of the touch, as well as to detect whether the touch has occurred. For example, the sensor array 11a may include a plurality of capacitive sensors each having a variable capacitance according to the touch and/or a plurality of resistive sensors each having a variable resistance according to the touch. As shown in FIG. 1A, the sensor array 11a may receive a plurality of transmission signals TXs from the touch processing circuit 12a through a plurality of first channels CH1s and may provide the touch processing circuit 12a with a plurality of reception signals RXs through a plurality of second channels CH2s. In some example embodiments, the plurality of first channels CH1s may be sequentially activated, and when a touch is detected based on the plurality of reception signals RXs, an X coordinate of the touch may be detected by the sensor array 11a based on the activated first channel. Also, a Y coordinate of the touch may be detected by the sensor array 11a according to the reception signal indicating the touch, among the plurality of reception signals RXs. In the specification here, the plurality of first channels CH1s may be referred to as a plurality of transmission channels and the plurality of second channels CH2s may be referred to as a plurality of reception channels.

The touch processing circuit 12a may provide the sensor array 11a with the plurality of transmission signals TXs and may receive the plurality of reception signals RXs from the sensor array 11a. Also, the touch processing circuit 12a may include first to m-th front-end circuits FE1, . . . , FEm, first to m-th digital error compensation circuits DEC1, . . . , DECm, and a controller 12_1a (m is an integer greater than 1), and the first to m-th front-end circuits FE1, . . . , FEm may respectively correspond to the plurality of second channels CH2s. For example, as shown in FIG. 1A, the plurality of second channels CH2s may include m channels and the plurality of reception signals RXs may include first to m-th reception signals RX1 to RXm. The first to m-th front-end circuits FE1, . . . , FEm may respectively receive the first to m-th reception signals RX1, . . . , RXm and may respectively output first to m-th digital signals D1, . . . , Dm. The first to m-th digital error compensation circuits DEC1, . . . , DECm may receive the first to m-th digital signals D1, . . . , Dm and may generate first to m-th digital output signals DO1, . . . , DOm indicating whether the touch has occurred and/or touch intensity. For example, as described later with reference to FIG. 3, the first to m-th digital signals D1, . . . , Dm may be digital signals for digital-to-analog conversion by a cyclic analog-to-digital converter, and the first to m-th digital error compensation circuits DEC1, . . . , DECm may perform a function of a digital error correction logic (DCL) in the cyclic analog-to-digital converter. In some example embodiments, the first to m-th digital error compensation circuits DEC1, . . . , DECm may be spaced from one another to be adjacent respectively to the first to m-th front-end circuits FE1, . . . , FEm, and as described later with reference to FIG. 1B, the touch processing circuit 12a may include a single digital error compensation circuit DEC that receives the first to m-th digital output signals DO1, . . . , DOm.

As described later with reference to FIG. 2, the first to m-th front-end circuits FE1, . . . , FEm may each include a reconfigurable circuit based on a control signal CTR transmitted from the controller 12_1a, and accordingly, may respectively process the first to m-th reception signals RX1, . . . , RXm with a reduced area to generate the first to m-th digital signals D1, . . . , Dm.

Unlike the example of FIG. 1A, when a plurality of analog signals are respectively generated by a plurality of front-end circuits receiving the plurality of reception signals RXs and the plurality of analog signals are provided to one analog-to-digital converter, the analog signals may be changed due to parasitic components and noise in paths through which the plurality of analog signals are transferred, and when a size of the sensor array 11a, e.g., a length in the Y-axis, increases, parasitic noise may further increase. Also, a time taken to detect the touch may increase due to time-divisional analog-to-digital conversion of the plurality of analog signals, and when a clock speed of the analog-to-digital converter increases in order to reduce the time taken to detect the touch, an issue such as an electromagnetic interference (EMI) may occur.

On the other hand, as shown in FIG. 1A, the digital signals are generated by the first to m-th front-end circuits FE1, . . . , FEm at locations respectively corresponding to the plurality of second channels CH2s, and thus, analog signals may not be transferred a distance corresponding to the size of the sensor array 11a, that is, the length in the Y-axis. Also, since the paths for transferring the analog signals may be omitted, the touch processing circuit 12a may have a simple structure and redesigning of the touch processing circuit 12a due to the change in the size of the sensor array 11a may be easily achieved.

The controller 12_1a may provide the control signal CTR to the first to m-th front-end circuits FE1, . . . , FEm. The controller 12_1a may be referred to as a timing controller that may control timings of the plurality of transmission signals TXs and may control timing of the control signal CTR based on the timings of the plurality of transmission signals TXs.

In some example embodiments, the controller 12_1a may include a combination logic circuit including a plurality of logic gates and may control timings of the plurality of transmission signals TXs and the control signal CTR according to states in a state machine.

In some other example embodiments, the controller 12_1a may be implemented using processing circuitry such as hardware including logic circuits, a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC), etc. The processing circuitry may be configured as a special purpose computer to control timings of the plurality of transmission signals TXs and to generate the control signal CTR to reconfigure at least a part of the first to m-th front-end circuits FE1, . . . , Fem.

The controller 12_1a may reconfigure at least a part of the first to m-th front-end circuits FE1, . . . , FEm through the control signal CTR. For example, each of the first to m-th front-end circuits FE1, . . . , FEm may include a plurality of switches, and the controller 12_1a may turn on or turn off each of the plurality of switches via the control signal CTR. The switch in a turn-on state may have electrically connected two ends, and the switch in a turn-off state may have electrically disconnected two ends. Accordingly, the controller 12_1a may reconfigure at least some of the first to m-th front-end circuits FE1, . . . , FEm with different circuits, according to an operating section.

Referring to FIG. 1B, the touch system 10b may include a sensor array 11b and a touch processing circuit 12b. The sensor array 11b may include a plurality of touch sensing electrodes TSE and a plurality of conducting lines CL connected respectively to the plurality of touch sensing electrodes TSE. Unlike the touch system 10a of FIG. 1A, in which the first channels CH1s for the plurality of transmission signals TXs and the second channels CH2s for the plurality of reception signals RXs are separated from each other, in the touch system 10b of FIG. 1B, the transmission signal TX and the first to m-th reception signals RX1, . . . , RXm may share a plurality of channels CHs.

The touch processing circuit 12b may include first to m-th multiplexers MUX1, . . . , MUXm, the first to m-th front-end circuits FE1, . . . , FEm, a digital error compensation circuit DEC, and a controller 12_1b. The first to m-th multiplexers MUX1, . . . , MUXm may provide the transmission signal TX to the plurality of channels CHs or may provide the first to m-th reception signals RX1, . . . , RXm transmitted through the plurality of channels CHs respectively to the first to m-th front-end circuits FE1, . . . , FEm. The first to m-th front-end circuits FE1, . . . , FEm may respectively generate first to m-th digital signals D1, . . . , Dm and may provide the first to m-th digital signals D1, . . . , Dm to the digital error compensation circuit DEC. The digital error compensation circuit DEC may generate first to m-th digital output signals DO1, . . . , DOm from the first to m-th digital signals D1, . . . , Dm. In some example embodiments, the digital error compensation circuit DEC may sequentially output the first to m-th digital output signals DO1, . . . , DOm, and as described above with reference to FIG. 1A, the touch processing circuit 12b may include a plurality of digital error compensation circuits that are respectively adjacent to the first to m-th front-end circuits FE1, . . . , FEm. Hereinafter, one or more example embodiments of the inventive concepts will be described with reference to the touch system 10a of FIG. 1A, but are not limited thereto.

Figure 2:
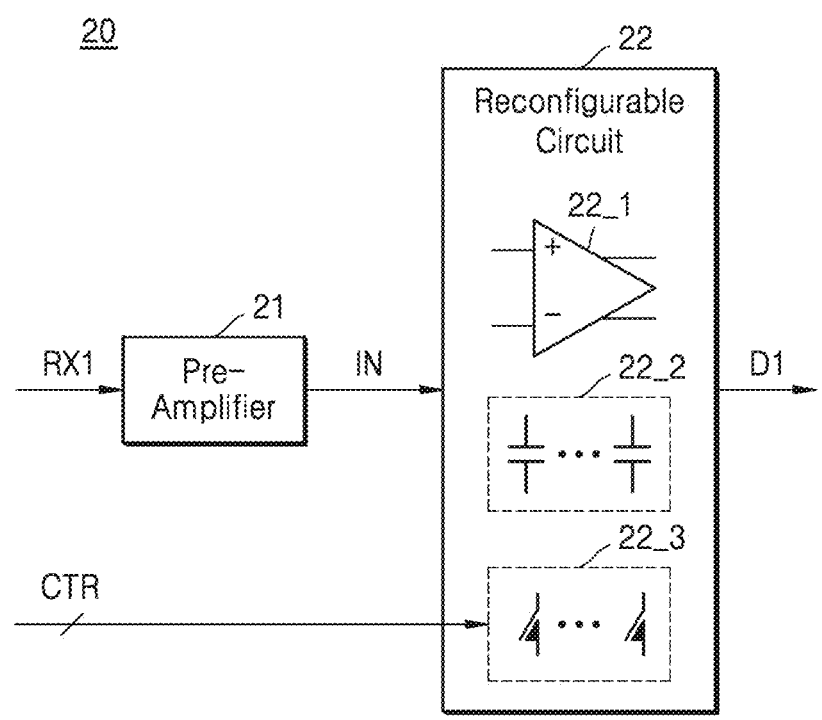
FIG. 2 is a block diagram showing an example of a front-end circuit according to an example embodiment.

FIG. 2 is a block diagram of a front-end circuit 20 according to an example embodiment.

Referring to FIGS. 1A, 1B and 2, the front-end circuit 20 of FIG. 2 is an example of the first front-end circuit FE1 shown in FIGS. 1A and 1B, and other front-end circuits shown in FIGS. 1A and 1B may be the same as or similar to the front-end circuit 20 of FIG. 2.

As described above with reference to FIGS. 1A and 1B, the front-end circuit 20 of FIG. 2 may receive a first reception signal RX1 and a control signal CTR and may output the first digital signal D1. As shown in FIG. 2, the front-end circuit 20 may include a pre-amplifier 21 and a reconfigurable circuit 22, and hereinafter, FIG. 2 will be described below with reference to FIG. 1A.

The pre-amplifier 21 may receive the first reception signal RX1 and may generate an input signal IN. As described above with reference to FIG. 1A, the first reception signal RX1 may be changed when a touch occurs on a sensor providing the first reception signal RX1 in the sensor array 11a. For example, when the sensor array 11a includes capacitive sensors, the transmission signal provided to the sensor array 11a through the active first channel may be a periodic signal that changes with a certain period, and the first reception signal RX1 may be a periodic signal induced by the transmission signal in the capacitive sensor and the pre-amplifier 21 may be referred to as a capacitance-voltage converter.

The reconfigurable circuit 22 may receive the input signal IN from the pre-amplifier 21 and may generate the first digital signal D1 by processing the input signal IN. As shown in FIG. 2, the reconfigurable circuit 22 may include an amplifier 22_1, a plurality of capacitors 22_2, and a plurality of switches 22_3. As described above with reference to FIG. 1A, the plurality of switches 22_3 may be turned on or turned off according to the control signal CTR, and the amplifier 22_1 and the plurality of capacitors 22_2 may be electrically interconnected to each other according to the control signal CTR to form different circuits. For example, as described later with reference to FIG. 3, the plurality of switches 22_3 may configure a first circuit CKT1 that accumulates deviations in the input signal IN among different phases and a second circuit CKT2 that converts the accumulated deviation into the first digital signal D1, according to the control signal CTR. Also, the plurality of switches 22_3 may configure a third circuit CKT3 sampling the accumulated deviation according to the control signal CTR. An example of the reconfigurable circuit 22 will be described below with reference to FIG. 3.

Figure 3:
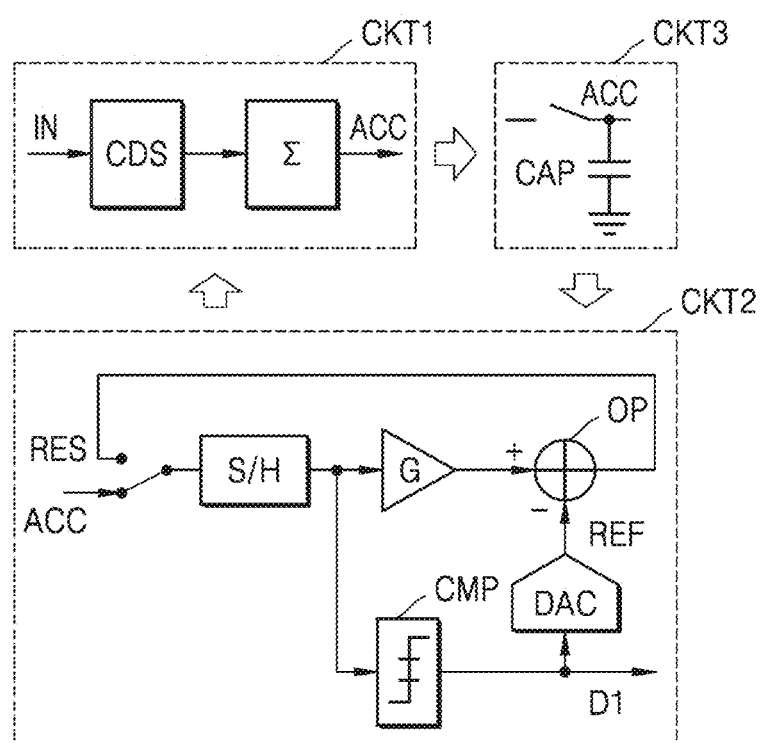
FIG. 3 is a block diagram showing example of a circuit configured by a reconfigurable circuit according to an operating period, according to an example embodiment.

FIG. 3 is a block diagram showing example of a circuit configured by the reconfigurable circuit 22 according to an operating section, according to an example embodiment. In detail, the block diagram of FIG. 3 schematically shows functions of circuits formed by the reconfigurable circuit 22 according to the operating sections. Hereinafter, FIG. 3 will be described with reference to FIG. 2.

Referring to FIGS. 2 and 3, the reconfigurable circuit 22 may sequentially operate in an integration period, a sampling period, and a conversion period. The controller 12_1a may control the plurality of switches 22_3 to form the first circuit CKT1 in the integration period, may control the plurality of switches 22_3 to form the third circuit CKT3 in the sampling period, and may control the plurality of switches 22_3 to form the second circuit CKT2 in the conversion period.

The first circuit CKT1 may perform a correlated double sampling (CDS) and accumulation. The CDS may denote that sampling is performed twice or more under different conditions in order to remove influence of undesirable noise or offset and common parts are removed from sampled values. The first circuit CKT1 may repeatedly perform the CDS with respect to the input signal IN and may accumulate the sampled values through the repeatedly performed CDS to generate an accumulated value ACC.

The third circuit CKT3 may sample the accumulated value ACC in the first circuit CKT1. For example, a voltage corresponding to the value ACC accumulated by the first circuit CKT1 and the third circuit CKT3 may sample the accumulated value ACC by storing a potential corresponding to the voltage accumulated in a capacitor CAP.

The second circuit CKT2 may convert the accumulated value ACC sampled by the third circuit CKT3 into the first digital signal D1. For example, the second circuit CKT2 may operate as a cyclic analog-to-digital converter as shown in FIG. 3, and may include a sample-hold block S/H, an amplification block G, an operation block OP, a digital-to-analog converter DAC, and a comparator CMP. The cyclic analog-to-digital converter may be referred to as an algorithm analog-to-digital converter and may generate the first digital signal D1 by sampling the accumulated value ACC and repeatedly converting a residual RES with respect to a reference value. For the cyclic analog-to-digital converter, a residual $RES_1$ of a current cycle, a residual $RES_0$ of a previous cycle, and a reference value $REF_0$ output from the digital-to-analog converter DAC may have a relation as expressed by Equation 1 below.

$$RES_1 = 2 \cdot RES_0 - REF_0 \quad \text{[Equation 1]}$$

Figure 4:
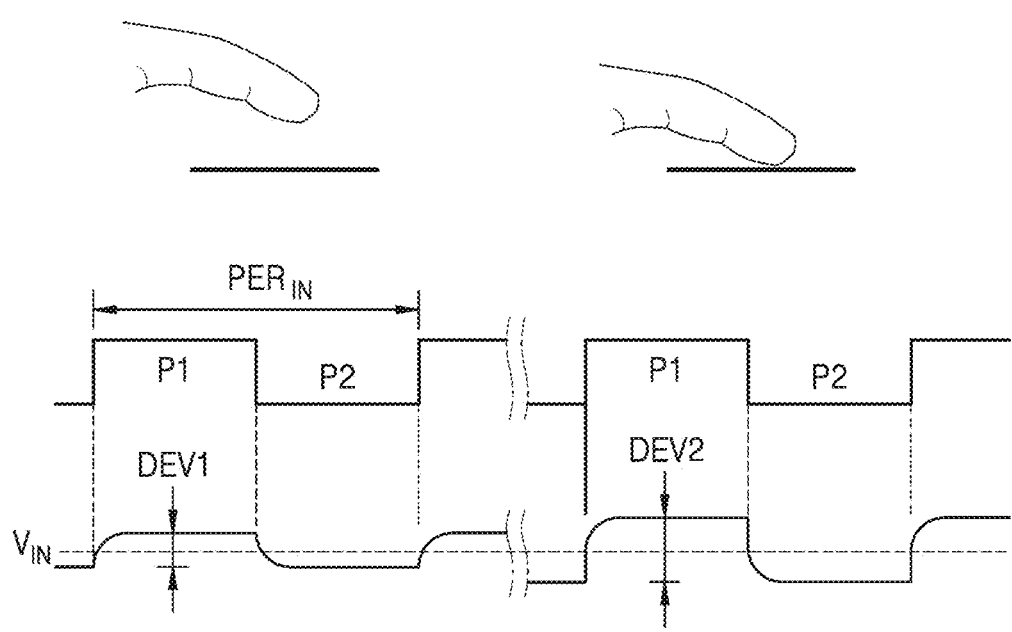
FIG. 4 is a timing diagram showing example of an input signal of FIG. 2, according to an example embodiment.
Figure 5:
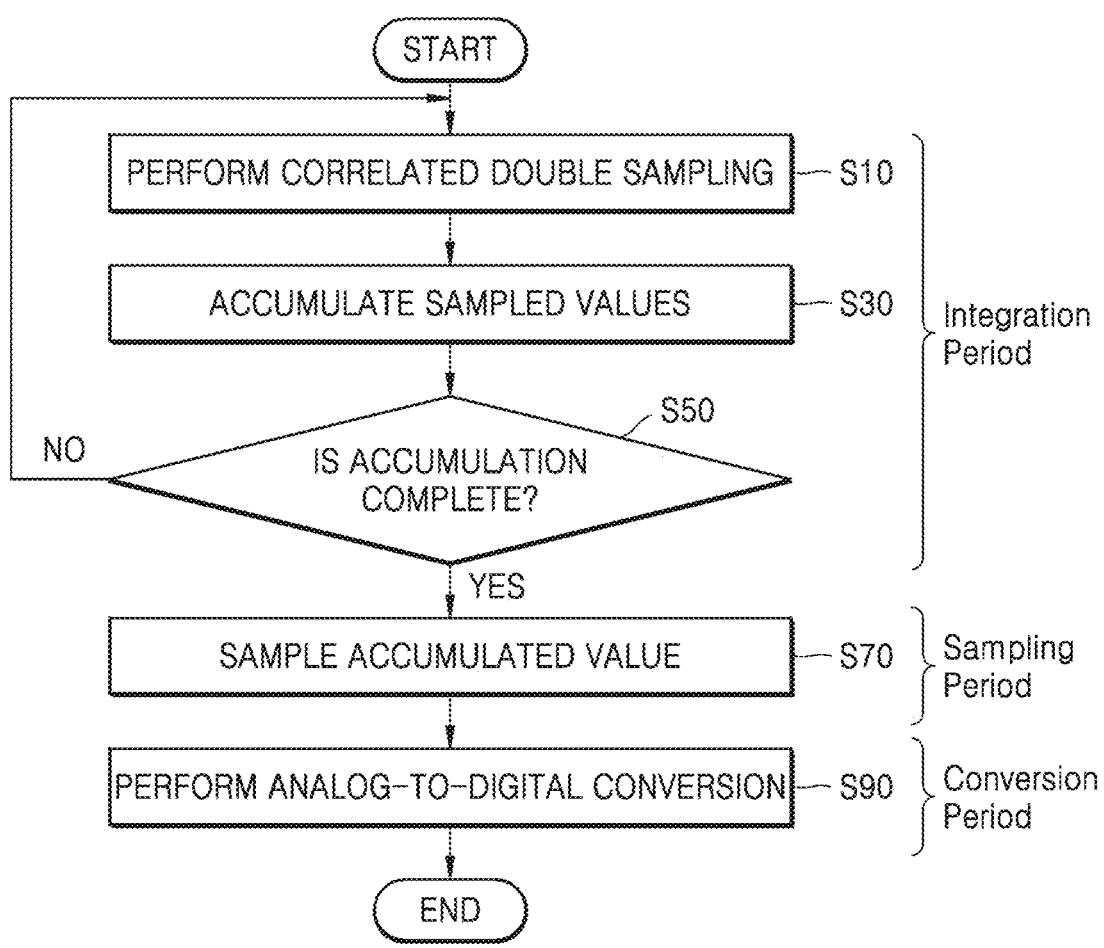
FIG. 5 is a flowchart illustrating an example of operating a touch processing circuit according to an example embodiment.

FIG. 4 is a timing diagram showing an example of the input signal IN of FIG. 2 according to an example embodiment, and FIG. 5 is a flowchart illustrating an example of an operation of the touch processing circuit according to an example embodiment. Hereinafter, FIGS. 4 and 5 will be described with reference to FIGS. 1A, 2, and 3.

Referring to FIG. 4, the input signal IN may have an input voltage $V_{IN}$ that changes with a period $PER_{IN}$ including a first phase P1 and a second phase P2. The input voltage $V_{IN}$ may have a deviation between the first phase P1 and the second phase P2, and the deviation may change according to the touch. For example, as shown in FIG. 4, when a touch does not occur or an object is approximate to a sensor array, the input voltage $V_{IN}$ may have a first deviation DEV1, but when there is a touch, the input voltage $V_{IN}$ may have a second deviation DEV2 that is greater than the first deviation DEV1. The deviation may be measured for each period $PER_{IN}$ of the input signal IN, and the measured deviations may be accumulated to detect whether the touch has occurred and/or an intensity of the touch.

Referring to FIG. 5, the touch processing circuit 12a may sequentially operate in the integration period, the sampling period, and the conversion period. Operations S10, S30, and S50 may be performed in the integration period, operation S70 may be performed in the sampling period, and operation S90 may be performed in the conversion period. Also, as described above with reference to FIG. 3, the reconfigurable circuit 22 may be configured as the first circuit CKT1 in the integration period, as the third circuit CKT3 in the sampling period, and as the second circuit CKT2 in the conversion period.

In operation S10, the CDS may be performed. For example, as described later with reference to FIGS. 7, 8A, and 8B, the reconfigurable circuit 22 may subtract the input voltage $V_{IN}$ of a previous phase from the input voltage $V_{IN}$ of a current phase $(1-Z^{-1})$, and accordingly, common noise or offset in continuous phases may be removed. The reconfigurable circuit 22 may sample the input voltage $V_{IN}$ in each of the first phase P1 and the second phase P2 through the CDS.

In operation S30, an operation of accumulating the sampled values may be performed. For example, the reconfigurable circuit 22 may accumulate the deviation between the input voltage $V_{IN}$ sampled in the first phase P1 and the input voltage $V_{IN}$ sampled in the second phase P2. To do this, the reconfigurable circuit 22 may function as an integrator and may accumulate the deviation for each period $PER_{IN}$ of the input signal IN.

In operation S50, an operation of determining whether the accumulation is complete may be performed. For example, the controller 12_1a may determine whether the deviations are accumulated a predetermined number of times. That is, when the periods $PER_{IN}$ of the predetermined number of input signals IN have finished, the accumulation may be finished. As shown in FIG. 4, when the accumulation is not complete, operation S10 may be performed next and the reconfigurable circuit 22 may stay in the integration period. On the other hand, when the accumulation is complete, operation S70 may be performed next and the reconfigurable circuit 22 may enter the sampling period.

In operation S70, an operation of sampling the accumulated value may be performed. For example, the reconfigurable circuit 22 may sample the deviations accumulated in operations S10 and S30. The accumulated deviation may be sampled into two or more capacitors as a voltage, and the voltage sampled to two or more capacitors may be provided as an input of an analog-to-digital conversion.

In operation S90, the analog-to-digital conversion may be performed. For example, the reconfigurable circuit 22 may convert the accumulated value that is sampled in operation S70 into the first digital signal D1. As described above with reference to FIG. 3, the reconfigurable circuit 22 may function as a cyclic analog-to-digital converter.

Figure 6:
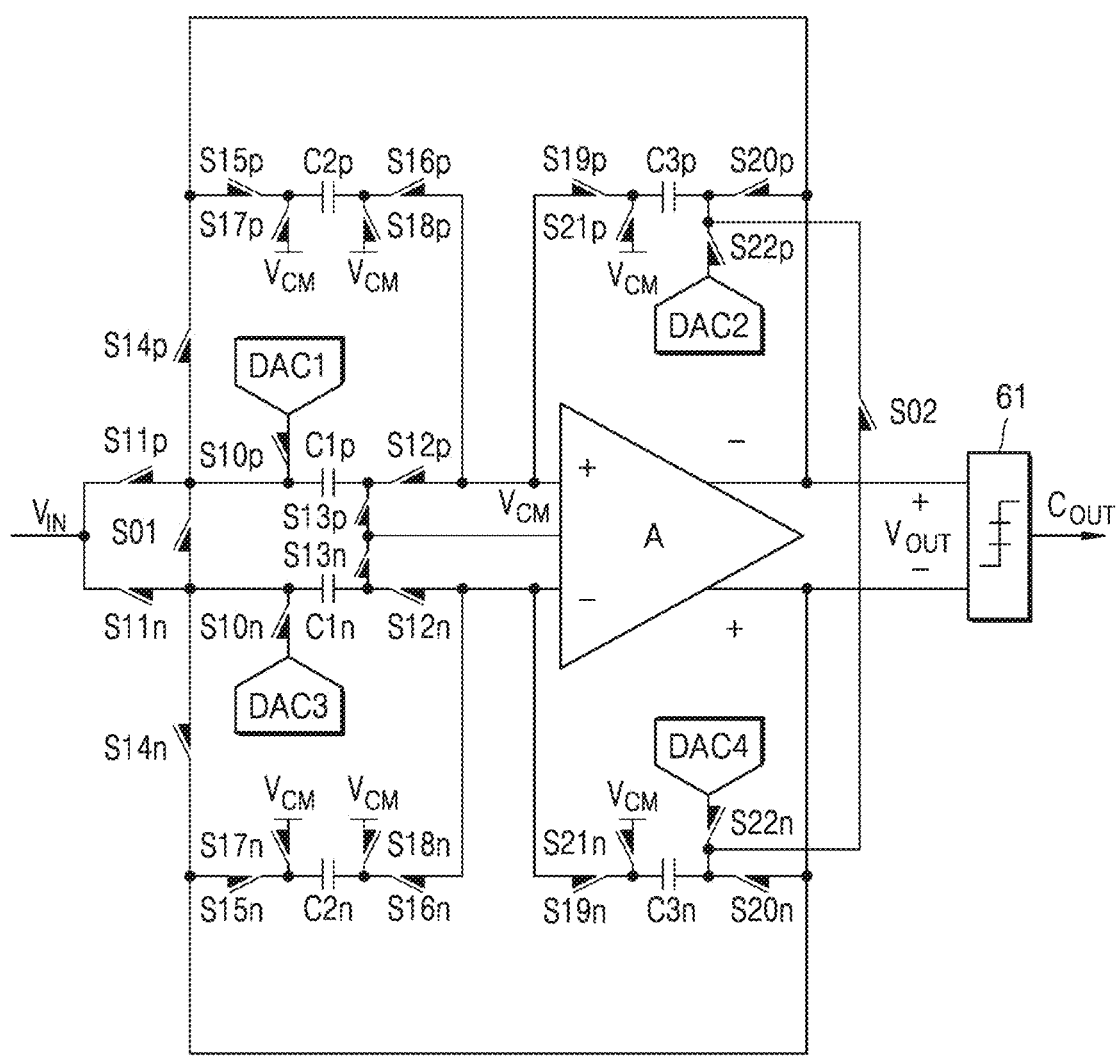
FIG. 6 is a circuit diagram of an example of a reconfigurable circuit according to an example embodiment.

FIG. 6 is a circuit diagram of an example of a reconfigurable circuit 60 according to an example embodiment. As described above with reference to FIG. 2, the reconfigurable circuit 60 of FIG. 6 may include an amplifier A, a plurality of capacitors C1p, C2p, C3p, C1n, C2n, and C3n, a plurality of switches S01, S02, S10p to S22p, and S10n to S22n, first to fourth digital-to-analog converters DAC1 to DAC4, and a comparator 61.

In some example embodiments, the amplifier A may include a differential amplifier and may receive a common mode voltage $V_{CM}$. The amplifier A may operate in both the integration period and the conversion period and may be shared by the first circuit CKT1 and the second circuit CKT2. An output voltage $V_{OUT}$ of the amplifier A may be fed-back by feedback capacitors and may be provided to the comparator 61.

The plurality of capacitors C1p, C2p, C3p, C1n, C2n, and C3n may include a first pair of capacitors C1p and C1n, a second pair of capacitors C2p and C2n, and a third pair of capacitors C3p and C3n. In some example embodiments, the plurality of capacitors C1p, C2p, C3p, C1n, C2n, and C3n may have the same capacitance. The plurality of switches S01, S02, S10p to S22p, and S10n to S22n may be in turned-on or turned-off states according to the control signal CTR provided by the controller 12_1a, and accordingly may configure different circuits from one another. Also, at least some of the plurality of switches S01, S02, S10p to S22p, and S10n to S22n may be switched between the turned-on state and the turned-off state according to a phase thereof in one operation section. In some example embodiments, each of the plurality of switches S01, S02, S10p to S22p, and S10n to S22n may be an n-channel field-effect transistor (NFET) and/or a p-channel field-effect transistor (PFET) having a gate to which the control signal CTR is applied.

The first to fourth digital-to-analog converters DAC1 to DAC4 and the comparator 61 may be used in the conversion period and may be included in the second circuit CKT2. The comparator 61 may receive an output voltage $V_{OUT}$ of the amplifier A and may generate an output signal COUT having three different values by comparing the output voltage $V_{OUT}$ with two reference levels, that is, a first reference level and a second reference level that is higher than the first reference level. Accordingly, the output signal COUT may be referred to have a value of 1.5 bits. The first to fourth digital-to-analog converters DAC1 to DAC4 may receive the output signal COUT from the comparator 61 and may output a reference voltage having a level corresponding to the value of the output signal COUT. Accordingly, the first to fourth digital-to-analog converters DAC1 to DAC4 may output the reference voltage of three different levels.

Figure 7:
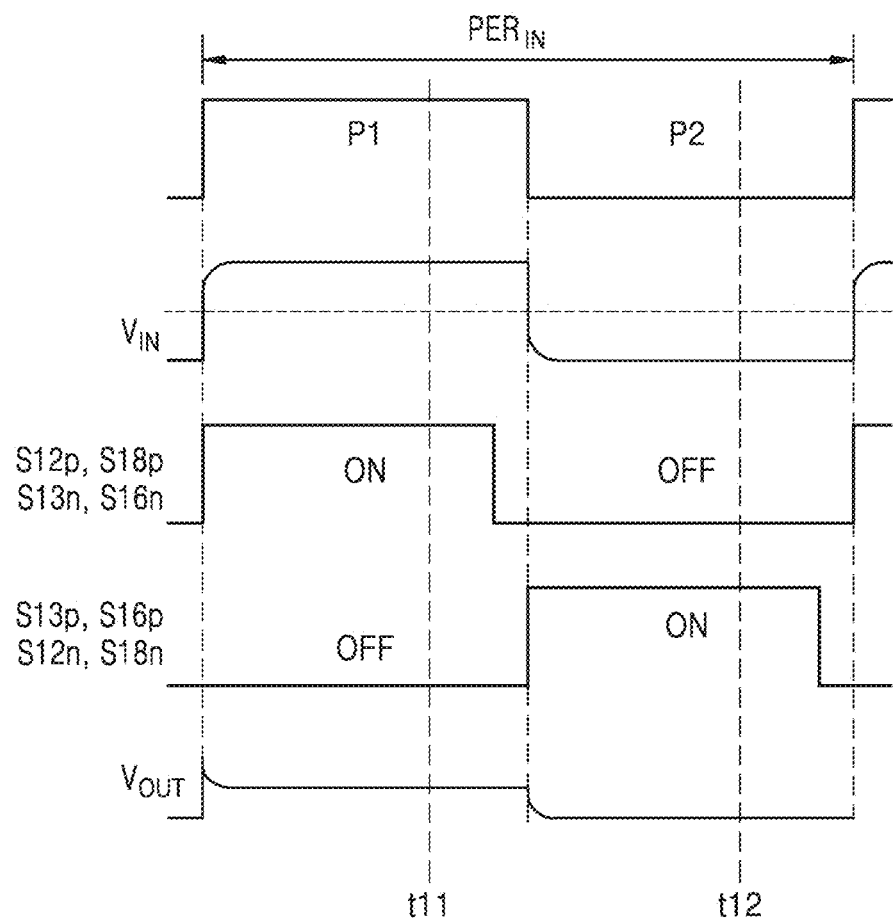
FIG. 7 is a timing diagram illustrating an operation of the reconfigurable circuit of FIG. 6 in an integration period, according to an example embodiment.
Figure 8A:
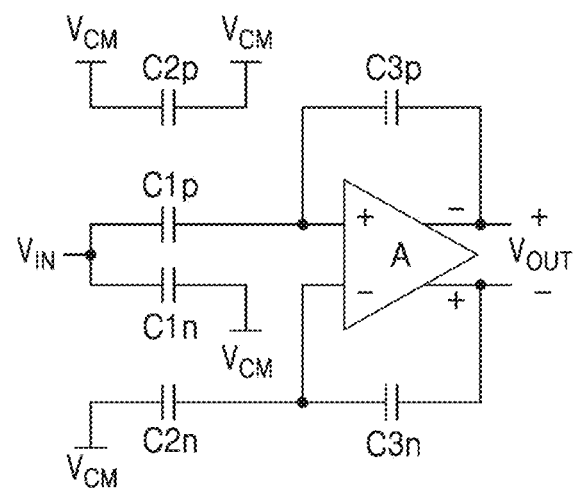
FIGS. 8A and 8B are equivalent circuit diagrams of the reconfigurable circuit of FIG. 6 in an integration period, according to one or more example embodiments.
Figure 8B:
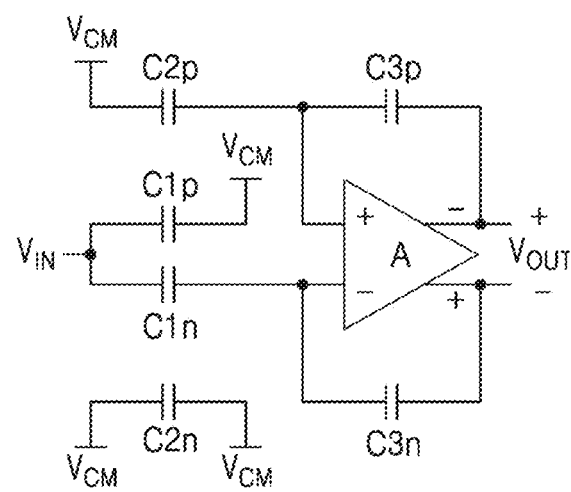

FIG. 7 is a timing diagram showing an operation of the reconfigurable circuit 60 of FIG. 6 in the integration period according to an example embodiment, and FIGS. 8A and 8B are equivalent circuit diagrams showing equivalent circuits of the reconfigurable circuit 60 of FIG. 6 in the integration period according to an example embodiment.

Referring to FIGS. 7, 8A and 8B, the timing diagram of FIG. 7 shows states of some of the input voltage $V_{IN}$, the output voltage $V_{OUT}$, and the plurality of switches S01, S02, S10p to S22p, and S10n to S22n according to time during a period $PER_{IN}$ of the input signal IN in the integration period. Also, the circuit diagram of FIG. 8A shows an equivalent circuit 80a of the reconfigurable circuit 60 at a time t11 included in the first phase P1 of FIG. 7, and FIG. 8B shows an equivalent circuit 80b of the reconfigurable circuit 60 at a time t12 included in the second phase P2 of FIG. 7.

As described above with reference to FIG. 3, the reconfigurable circuit 60 may be configured as the first circuit CKT1 in the integration period. To do this, some switches S11p, S17p, S19p, S20p, S11n, S17n, S19n, and S20n may be in turned-on states, some switches S01, S02, S10p, S14p, S15p, S21p, S22p, S10n, S14n, S15n, S21n, and S22n may be in turned-off states, and the other switches S12p, S13p, S16p, S18p, S12n, S13n, S16n, and S18n may be switched between the turned-on states and turned-off states according to the first phase P1 and the second phase P2. Accordingly, as described later, the first pair of capacitors C1p and C1n may sample the input voltage $V_{IN}$, the second pair of capacitors C2p and C2n may provide the common mode voltage $V_{CM}$ to the amplifier A as a virtual ground, and the third pair of capacitors C3p and C3n may function as feedback capacitors of the amplifier A.

Referring to FIG. 7, the switches S12p, S18p, S13n, and S16n may be turned on when the first phase P1 starts and may be switched into the turned-off states before the first phase P1 ends. Also, the switches S13p, S16p, S12n, and S18n may be maintained in turned-off states in the first phase P1. Accordingly, the equivalent circuit 80a of FIG. 8A may be formed at the time tn. At the time the switch S16n is turned off, the capacitor C2n of the second pair of capacitors C2p and C2n may sample the input voltage $V_{IN}$. Also, the input voltage $V_{IN}$ may be applied to the capacitor C1p of the first pair of capacitors C1p and C1n, and as described later, since the input voltage $V_{IN}$ in the previous phase of the first phase P1 is sampled by the capacitor C1p, an operation of subtracting the previous input voltage $V_{IN}$ from the current input voltage $V_{IN}$ may be performed. As described later, one of the two ends of the capacitor C2n of the second pair of capacitors C2p and C2n, to which the common mode voltage $V_{CM}$ is commonly applied in the previous phase, may be connected to an inverting input of the amplifier A. Accordingly, a virtual ground may be provided to the amplifier A as the common mode voltage $V_{CM}$ and an integral gain may be C1p/C3p.

The switches S12p, S18p, S13n, and S16n may be maintained in turned-off states in the second phase P2. Also, when the second phase P2 starts, the switches S13p, S16p, S12n, and S18n may be turned on and may be switched to the turned-off states before the second phase P2 ends. Accordingly, the equivalent circuit 80b of FIG. 8B may be formed at the time t12. At the time the switch S16p is turned off, the capacitor C2p in the second pair of capacitors C2p and C2n may sample the input voltage $V_{IN}$. Also, the input voltage $V_{IN}$ may be applied to the capacitor C1n of the first pair of capacitors C1p and C1n, and as described later, since the input voltage $V_{IN}$ in the first phase P1 is sampled by the capacitor C1n, an operation of subtracting the previous input voltage $V_{IN}$ from the current input voltage $V_{IN}$ may be performed. One of the two ends of the capacitor C2p in the second pair of capacitors C2p and C2n, to which the common mode voltage $V_{CM}$ is commonly applied in the first phase P1, may be connected to a non-inverting input of the amplifier A. Accordingly, a virtual ground may be provided to the amplifier A as the common mode voltage $V_{CM}$ and an integral gain may be C1n/C3n.

Figure 9A:
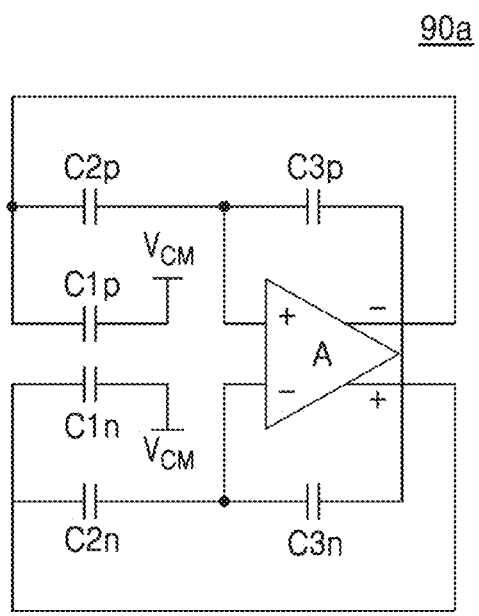
FIGS. 9A and 9B are equivalent circuit diagrams of the reconfigurable circuit of FIG. 6 in a sampling period, according to one or more example embodiments.
Figure 9B:
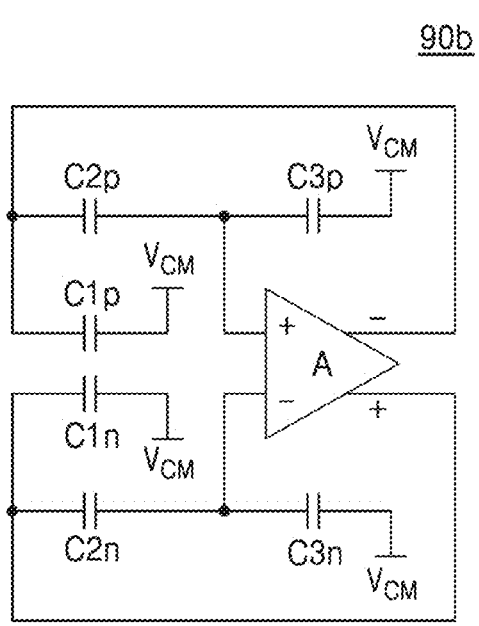

FIGS. 9A and 9B are equivalent circuit diagrams of the reconfigurable circuit 60 of FIG. 6 in a sampling period, according to one or more embodiments. As described above with reference to FIG. 3, the reconfigurable circuit 60 may be configured as the third circuit OKT3 in the sampling period. As described later, in the equivalent circuits 90a and 90b of FIGS. 9A and 9B, the first pair of capacitors C1p and C1n and the third pair of capacitors C3p and C3n may sample accumulated voltages, and the second pair of capacitors C2p and C2n may function as feedback capacitors of the amplifier A.

Referring to FIG. 9A, some switches S02, S13p, S14p, S15p, S16p, S19p, S20p, S13n, S14n, S15n, S16n, S19n, and S20n may be in turned-on states and the other switches S01, S11p, S12p, S17p, S18p, S21p, S22p, S11n, S12n, S17n, S18n, S21n, and S22n may be in turned-off states in the sampling period. Accordingly, the equivalent circuit 90a of FIG. 9A may be formed. As described above with reference to FIGS. 7, 8A, and 8B, since a charge corresponding to the accumulated voltage may be charged in the third pair of capacitors C3p and C3n and the common mode voltage $V_{CM}$ is applied to two ends of the second pair of capacitors C2p and C2n in the integration period, a charge corresponding to that of the third pair of capacitors C3p and C3n by the equivalent circuit 90a of FIG. 9A may be charged in the first pair of capacitors C1p and C1n. For example, the charge discharged from the third pair of capacitors C3p and C3n may be transferred to the second pair of capacitors C2p and C2n, and accordingly, the charge corresponding to the accumulated voltage may be sampled by the first pair of capacitors C1p and C1n.

Referring to FIG. 9B, some switches S13p, S14p, S15p, S16p, S19p, S20p, S22p, S13n, S14n, S15n, S16n, S19n, S20n, and S22n may be in the turned-on states and the other switches S01, S02, S11p, S12p, S17p, S18p, S21p, S11n, S12n, S17n, S18n, and S21n may be in the turned-off states in the sampling period, and the second digital-to-analog converter DAC2 and the fourth digital-to-analog converter DAC4 may output the common mode voltage $V_{CM}$. Accordingly, the equivalent circuit 90b of FIG. 9B may be formed. That is, ends of the third pair of capacitors C3p and C3n in the equivalent circuit 90a of FIG. 9A may be connected to each other, whereas the common mode voltage $V_{CM}$ may be applied to ends of the third pair of capacitors C3p and C3n in the equivalent circuit 90b of FIG. 9B.

Figure 10:
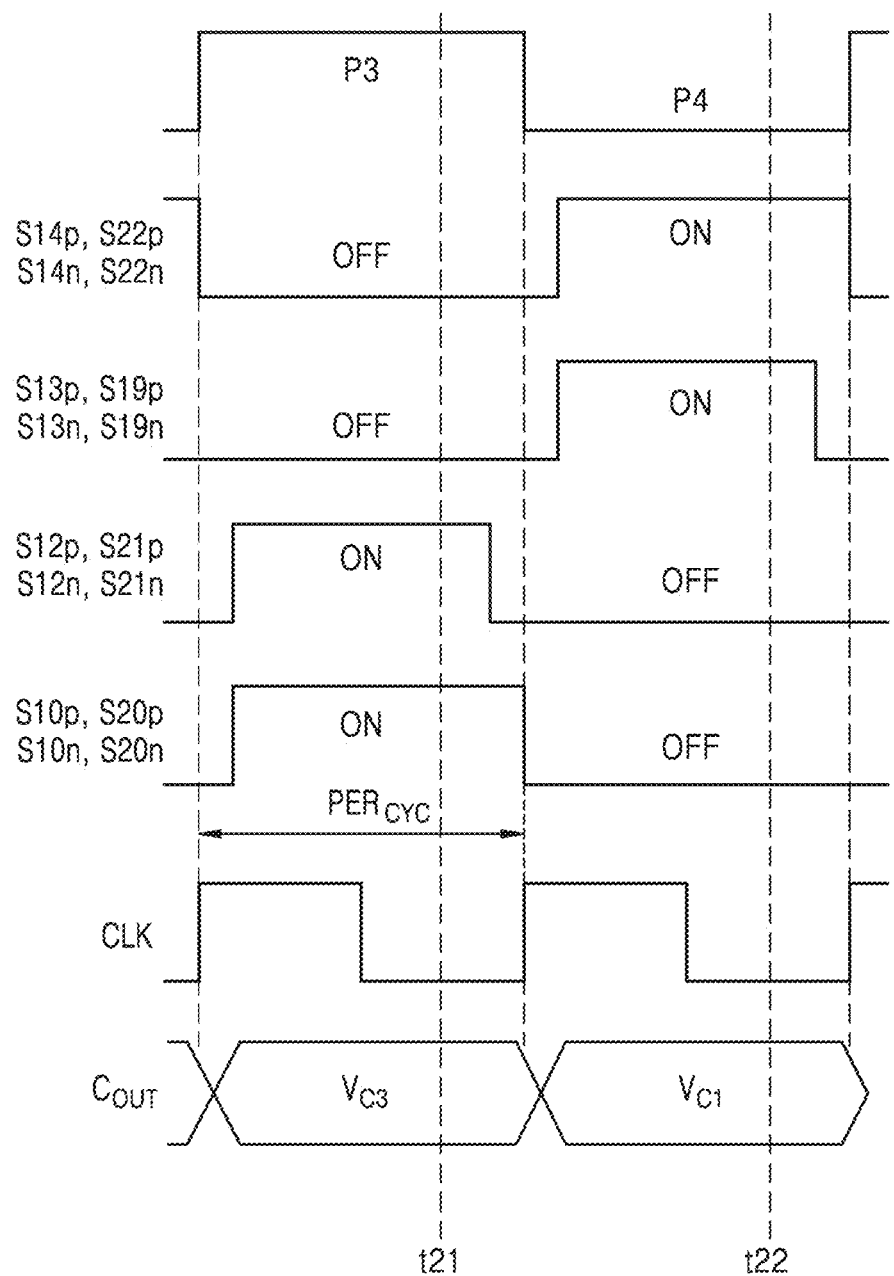
FIG. 10 is a timing diagram illustrating an operation of the reconfigurable circuit of FIG. 6 in a conversion period, according to an example embodiment.
Figure 11A:
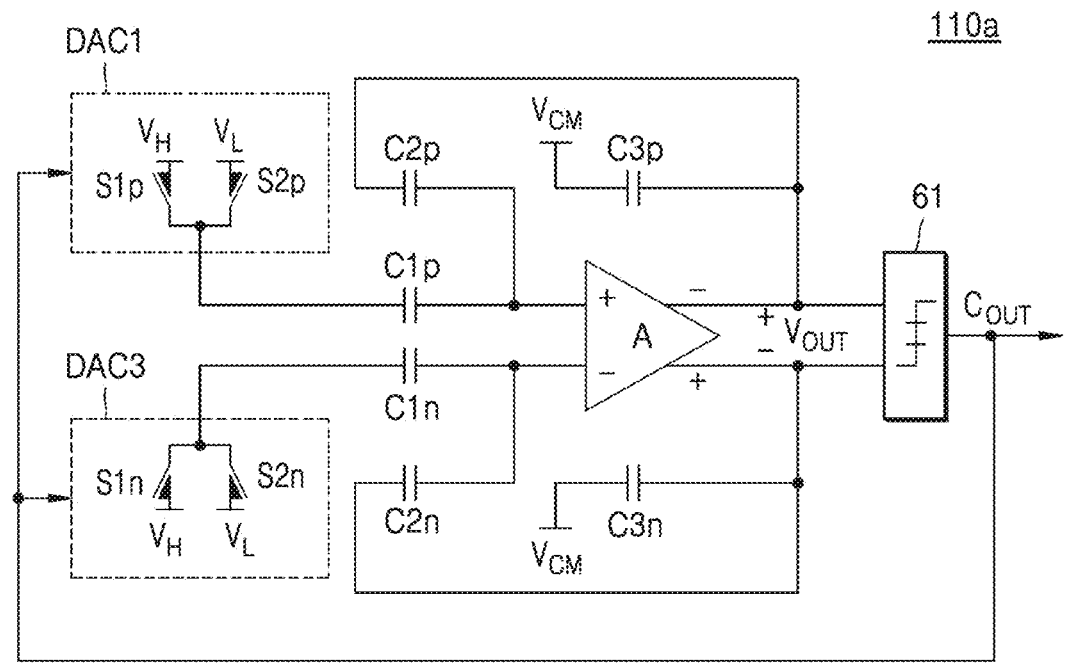
FIGS. 11A and 11B are equivalent circuit diagrams of the reconfigurable circuit of FIG. 6 in a conversion period, according to one or more example embodiments.
Figure 11B:
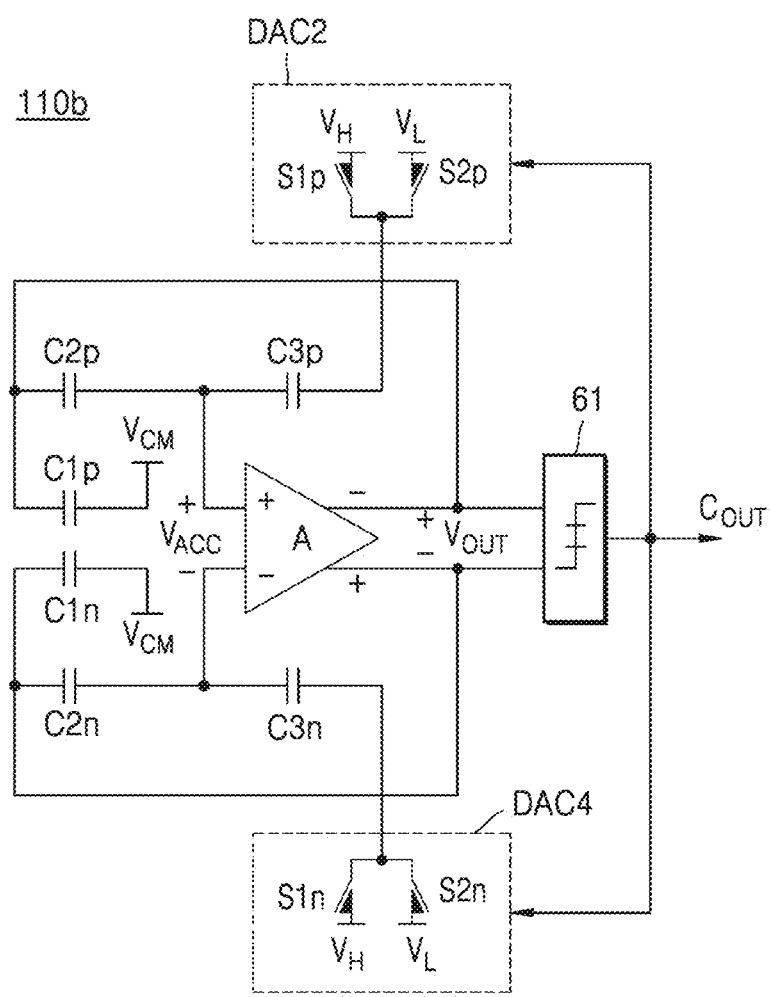

FIG. 10 is a timing diagram showing an operation of the reconfigurable circuit 60 of FIG. 6 in the conversion period according to an example embodiment, and FIGS. 11A and 11B are equivalent circuit diagrams showing equivalent circuits of the reconfigurable circuit 60 of FIG. 6 in the conversion period according to an example embodiment. In detail, the timing diagram of FIG. 10 shows states of some of the plurality of switches S01, S02, S10p to S22p, and S10n to S22n in the conversion period, a clock signal CLK, and an output signal COUT from the comparator 61 according to time. Also, the circuit diagram of FIG. 11A shows an equivalent circuit 110a of the reconfigurable circuit 60 at a time t21 included in the third phase P3 of FIG. 10, and FIG. 11B shows an equivalent circuit 110b of the reconfigurable circuit 60 at a time t22 included in the fourth phase P4 of FIG. 10. Hereinafter, redundant descriptions about FIGS. 11A and 11B will be omitted.

As described above with reference to FIG. 3, the reconfigurable circuit 60 may be configured as the second circuit CKT2 in the conversion period. To do this, some switches S15p, S16p, S15n, and S16n may be in turned-on states, some switches S01, S02, S11p, S17p, S18p, S11n, S17n, and S18n may be in turned-off states, and the other switches S10p, S12p, S13p, S14p, S19p, S20p, S21p, S22p, S10n, S12n, S13n, S14n, S19n, S20n, S21n, and S22n may be switched between the turned-on states and the turned-off states according to the third phase P3 and the fourth phase P4. Accordingly, as described later, the first pair of capacitors C1p and C1n and the third pair of capacitors C3p and C3n may sample the output voltage $V_{OUT}$ of the amplifier A, and the second pair of capacitors C2p and C2n may function as feedback capacitors of the amplifier A.

Referring to FIGS. 11A and 11B, the first to fourth digital-to-analog converters DAC1 to DAC4 may include two switches. For example, the first digital-to-analog converter DAC1 may include a first switch S1p having an end to which a high level voltage $V_H$ is applied and a second switch S2p having an end to which a low level voltage $V_L$ is applied. The first digital-to-analog converter DAC1 may turn on one of the first and second switches S1p and S2p and turn off the other, may turn on both the first and second switches S1p and S2p, or may turn off both the first and second switches S1p and S2p in response to an output signal COUT of 1.5 bits. An intermediate voltage between the high level voltage $V_H$ and the low level voltage $V_L$ may be the common mode voltage $V_{CM}$, and accordingly, the first digital-to-analog converter DAC1 may output one of the high level voltage $V_H$, the common mode voltage $V_{CM}$, and the low level voltage $V_L$ in response to the output signal COUT. The intermediate voltage (e.g., $V_{CM}$) between the high level voltage $V_H$ and the low level voltage $V_L$ may be generated by turning on both the first and second switches S1p and S2p, or may be provided to the first pair of capacitors C1p and C1n by turning off both the first and second switches S1p and S2p and electrically connecting outputs of the first digital-to-analog converter DAC1 and the second digital-to-analog converter DAC2 (e.g., by turning on the switch S01 of FIG. 6). In some example embodiments, the two switches included in the first to fourth digital-to-analog converters DAC1 to DAC4 may be both turned off according to the control signal CTR, and accordingly, switches S10p, S22p, S10n, and S22n connected to outputs of the first to fourth digital-to-analog converters DAC1 to DAC4 may be omitted in the reconfigurable circuit 60 of FIG. 6.

Referring back to FIG. 10, the switches S14p, S22p, S14n, and S22n and the switches S13p, S19p, S13n, and S19n may be in turned-off states in a third phase P3. Also, after the third phase P3 starts, the switches S12p, S21p, S12n, and S21n and the switches S10p, S20p, S10n, and S20n may be turned on, and the switches S12p, S21p, S12n, and S21n may be switched to turned-off states before the third phase P3 ends. Accordingly, the equivalent circuit 110a of FIG. 11A may be formed at the time t21. At the time the switches S21p and S21n are turned off, the third pair of capacitors C3p and C3n may sample the output voltage $V_{OUT}$. Outputs from the first digital-to-analog converter DAC1 and the third digital-to-analog converter DAC3, that is, reference voltages, may be applied to the first pair of capacitors C1p and C1n, and as described later, since the output voltage $V_{OUT}$ of the previous phase of the third phase P3 is sampled by the first pair of capacitors C1p and C1n, operation as expressed by Equation 1 above may be performed by the first pair of capacitors C1p and C1n and the second pair of capacitors C2p and C2n.

After a fourth phase P4 starts, the switches S14p, S22p, S14n, and S22n and the switches S13p, S19p, S13n, and S19n may be turned on, and the switches S13p, S19p, S13n, and S19n may be switched into the turned-off state before the fourth phase P4 ends. Also, in the fourth phase P4, the switches S12p, S21p, S12n, and S21n and the switches S10p, S20p, S10n, and S20n may be in turned-off states. Accordingly, the equivalent circuit 110b of FIG. 11B may be formed at the time t22. At the time the switches S13p and S13n are turned off, the first pair of capacitors C1p and C1n may sample the output voltage $V_{OUT}$. Outputs from the second digital-to-analog converter DAC2 and the fourth digital-to-analog converter DAC4, that is, reference voltages, may be applied to the third pair of capacitors C3p and C3n, and since the output voltage $V_{OUT}$ of the third phase P3 is sampled by the third pair of capacitors C3p and C3n, the operation as expressed by Equation 1 above may be performed by the third pair of capacitors C3p and C3n and the second pair of capacitors C2p and C2n.

The clock signal CLK may be provided to the comparator 61, and the comparator 61 may update the value of the output signal COUT in response to a rising edge of the clock signal CLK. A cyclic period $PER_{CYC}$ may correspond to a period of the clock signal CLK, and in some example embodiments, the cyclic period $PER_{CYC}$ may be less than the period $PER_{IN}$ of the input signal IN.

Figure 12:
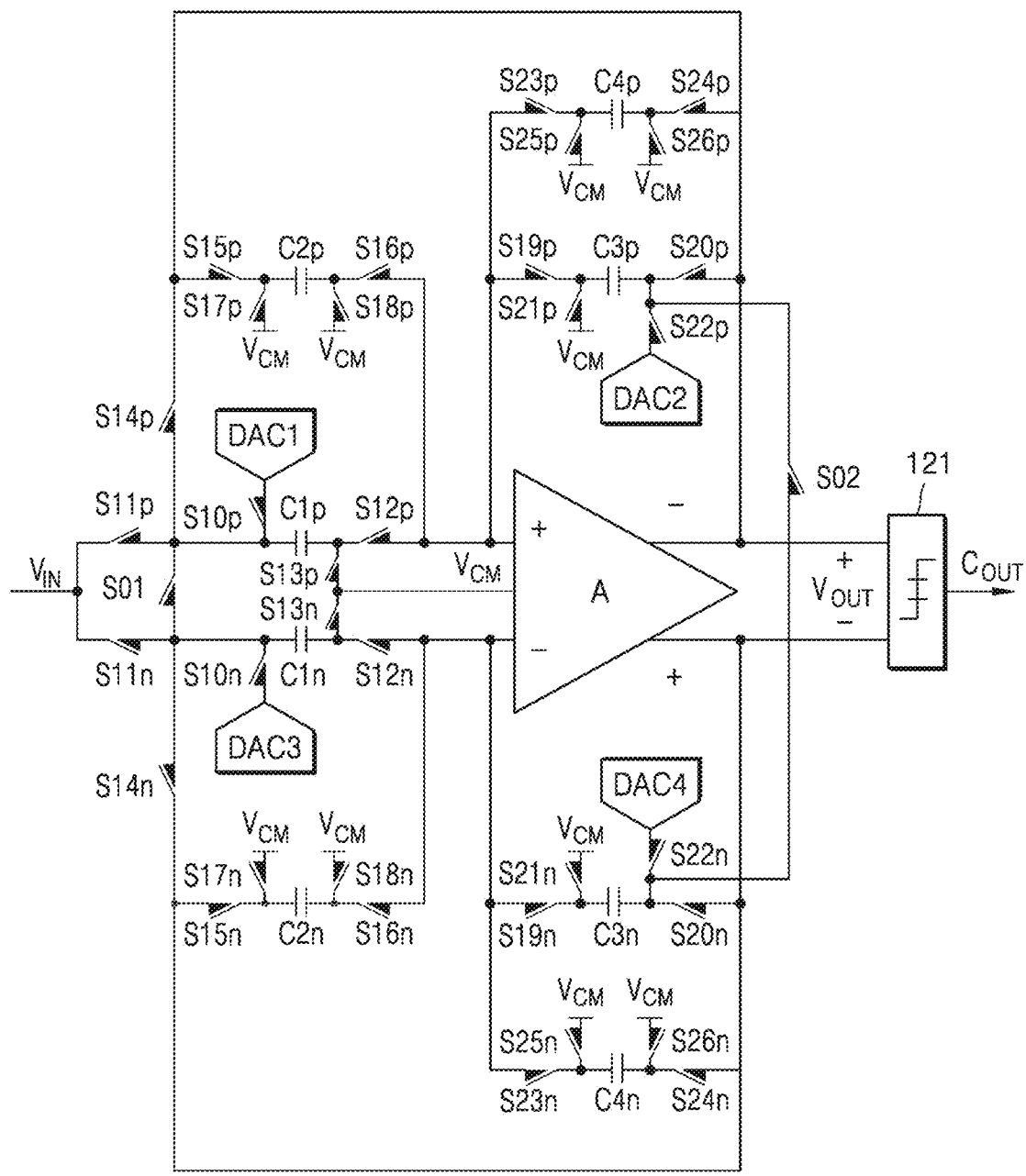
FIG. 12 is a circuit diagram of an example of a reconfigurable circuit according to an example embodiment.

FIG. 12 is a circuit diagram of an example of a reconfigurable circuit 120 according to an example embodiment.

Referring to FIG. 12, similarly to the reconfigurable circuit 60 of FIG. 6, the reconfigurable circuit 120 of FIG. 12 may include the amplifier A, the first pair of capacitors C1p and C1n, the second pair of capacitors C2p and C2n, the third pair of capacitors C3p and C3n, the switches S01, S02, S10p to S22p, and S10n to S22n, the first to fourth digital-to-analog converters DAC1 to DAC4, and a comparator 121, and may further include a fourth pair of capacitors C4p and C4n and switches S23p to S26p and S23n to S26n. Hereinafter, descriptions about FIG. 12 that are already provided above with reference to FIG. 6 will be omitted.

The fourth pair of capacitors C4p and C4n may additionally function as feedback capacitors of the amplifier A in the integration period. For example, the switches S23p, S24p, S23n, and S24n may be in turned-on states and the switches S25p, S26p, S25n, and S26n may be in turned-off states in the integration period. Accordingly, feedback capacitance of the amplifier A may be "C3p+C4p" in the first phase P1 and may be "C3n+C4n" in the second phase P2. Thus, the integral gain may be "C1p/(C3p+C4p)" in the first phase P1 and may be "C1n/(C3n+C4n)" in the second phase P2. The fourth pair of capacitors C4p and C4n may have the same capacitance as that of the other capacitors, or may have a different capacitance, e.g., greater capacitance than those of the other capacitors, according to a required integral gain.

The fourth pair of capacitors C4p and C4n may be included in the first circuit CKT1 in the integration period as described above, and may not be included in the third circuit OKT3 of the sampling period and the second circuit CKT2 of the conversion period. For example, in the sampling period and the conversion period, the switches S23p, S24p, S23n, and S24n may be in turned-off states and the switches S25p, S26p, S25n, and S26n may be in turned-on states. Accordingly, when the integration period ends, a charge corresponding to the accumulated voltage may be charged in the fourth pair of capacitors C4p and C4n like in the third pair of capacitors C3p and C3n, and when the sampling period starts, the charge that is charged in the fourth pair of capacitors C4p and C4n may be discharged.

Figure 13:
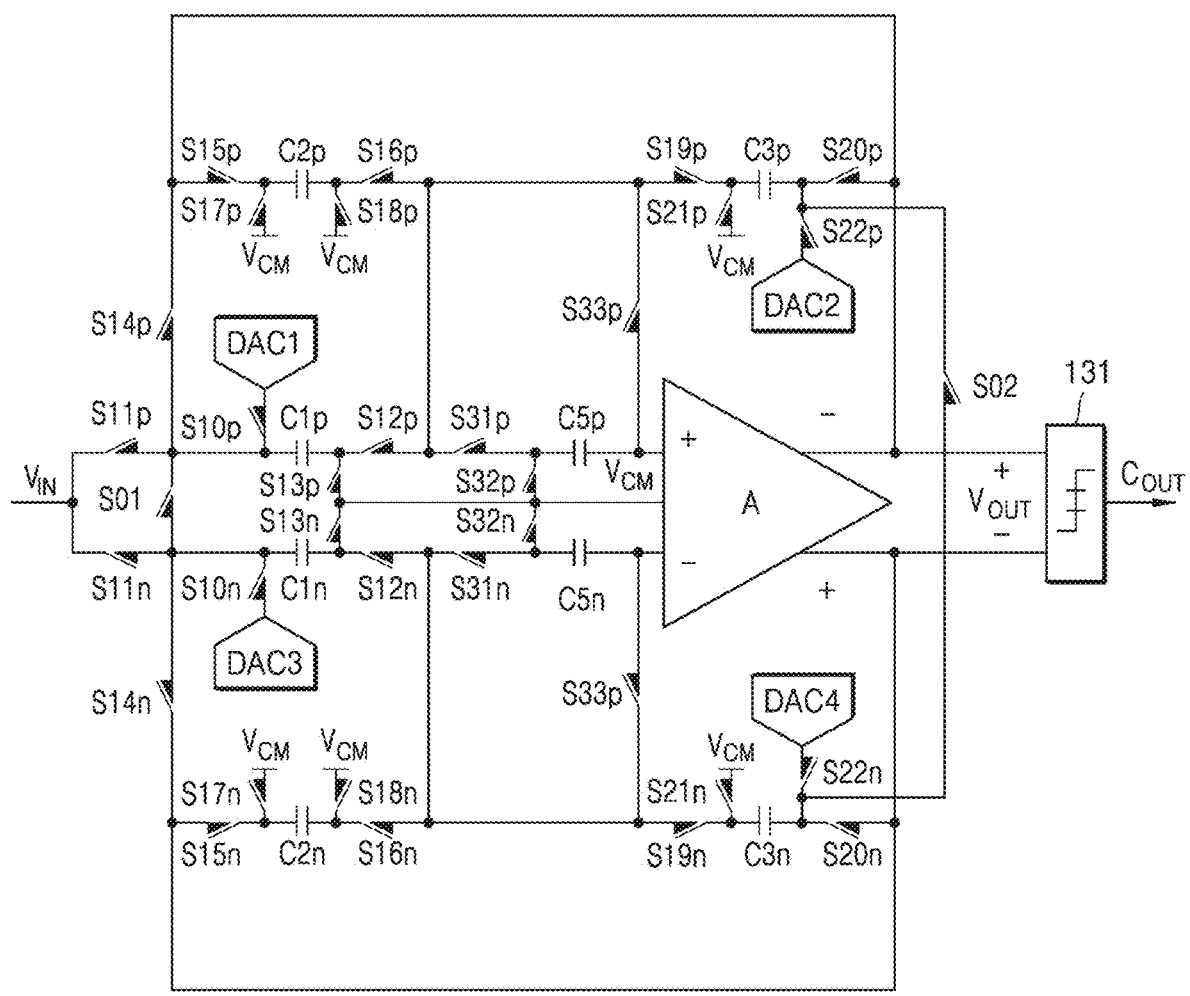
FIG. 13 is a circuit diagram of an example of a reconfigurable circuit according to an example embodiment.

FIG. 13 is a circuit diagram of an example of a reconfigurable circuit 130 according to an example embodiment.

Referring to FIG. 13, similarly to the reconfigurable circuit 60 of FIG. 6, the reconfigurable circuit 130 of FIG. 13 may include the amplifier A, the first pair of capacitors C1p and C1n, the second pair of capacitors C2p and C2n, the third pair of capacitors C3p and C3n, the switches S01, S02, S10p to S22p, and S10n to S22n, the first to fourth digital-to-analog converters DAC1 to DAC4, and a comparator 131, and may further include a fifth pair of capacitors C5p and C5n and switches S31p to S33p and S31n to S33n. Hereinafter, descriptions about FIG. 13 that are already provided above with reference to FIG. 6 will be omitted.

The fifth pair of capacitors C5p and C5n may be used to compensate for an input offset voltage of the amplifier A in the integration period. In order to prevent the input offset voltage of the amplifier A from being accumulated in the integration period, the input offset voltage of the amplifier A may be sampled in the fifth pair of capacitors C5p and C5n. For example, as described later with reference to FIGS. 14, 15A, and 15B, when the switches S32p, S33p, S32n, and S33n are in the turned-on states and the switches S31p and S31n are in the turned-off states, the input offset voltage of the amplifier A may be sampled in the fifth pair of capacitors C5p and C5n. Also, when the switches S32p, S33p, S32n, and S33n are in the turned-off states and the switches S31p and S31n are in the turned-on states, the input offset voltage sampled in the fifth pair of capacitors C5p and C5n may be compensated for in the integration operation.

Hereinafter, an example of the operation of compensating for the input offset voltage of the amplifier A will be described below with reference to FIGS. 14, 15A, and 15B.

Figure 14:
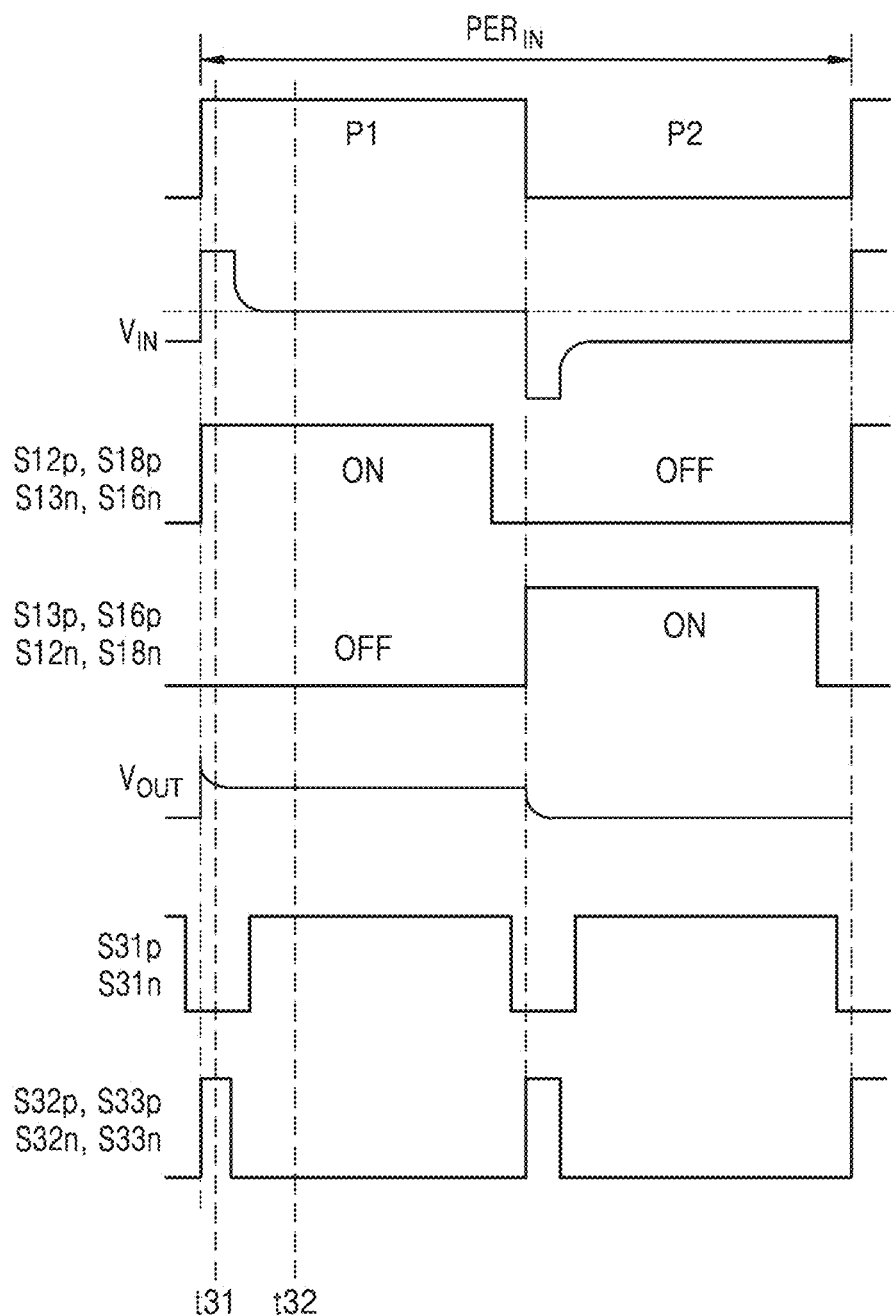
FIG. 14 is a timing diagram illustrating an operation of the reconfigurable circuit of FIG. 13 in an integration period, according to an example embodiment.
Figure 15A:
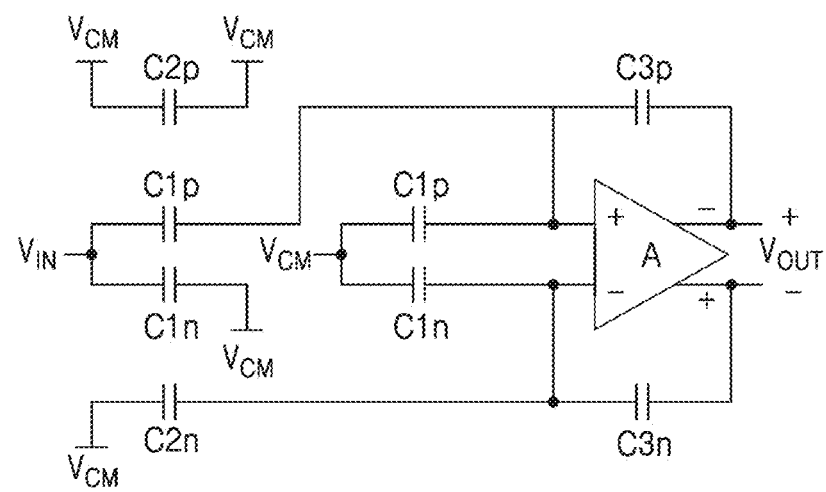
FIGS. 15A and 15B are equivalent circuit diagrams of the reconfigurable circuit of FIG. 13 in an integration period, according to one or more example embodiments.
Figure 15B:
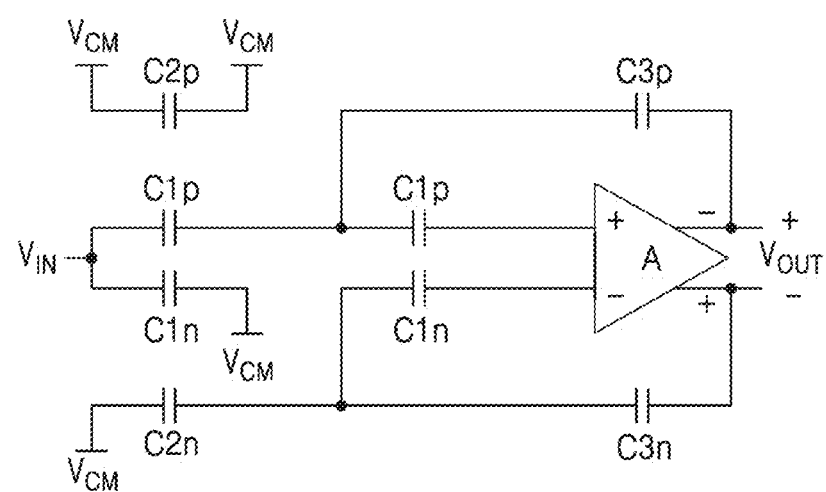

FIG. 14 is a timing diagram showing an operation of the reconfigurable circuit 130 of FIG. 13 in the integration period according to an example embodiment, and FIGS. 15A and 15B are equivalent circuit diagrams showing equivalent circuits of the reconfigurable circuit 130 of FIG. 13 in the integration period according to an example embodiment. In detail, the timing diagram of FIG. 14 shows states of some of the input voltage $V_{IN}$, the output voltage $V_{OUT}$, and the plurality of switches S01, S02, S10p to S22p, S10n to S22n, S31p to S33p, and S31n to S33n according to time during a period $PER_{IN}$ of the input signal IN in the integration period. Also, the circuit diagram of FIG. 15A shows an equivalent circuit 140a of the reconfigurable circuit 130 at a time T31 included in the first phase P1 of FIG. 14, and FIG. 15B shows an equivalent circuit 140b of the reconfigurable circuit 130 at a time T32 included in the second phase P2 of FIG. 14. Hereinafter, an operation for compensating for the input offset of the amplifier A performed in the first phase P1 will be described below, but the operation of compensating for the input offset of the amplifier A may be similarly performed in the second phase P2. Hereinafter, descriptions about FIGS. 14, 15A, and 15B, which are already provided above with reference to FIGS. 7, 8A, and 8B, will be omitted.

Referring to FIG. 14, the switches S31p and S31n may be turned off before starting the first phase P1, and the switches S32p, S33p, S32n, and S33n may be turned on when the first phase P1 starts. Accordingly, the equivalent circuit 150a of FIG. 15A may be formed at the time t31. At the time the switches S32p, S33p, S32n, and S33n are turned off, the fifth pair of capacitors C5p and C5n may sample the input offset voltage of the amplifier A.

After switching the switches S32p, S33p, S32n, and S33n into the turned-off states, the switches S31p and S31n may be turned on. Accordingly, the equivalent circuit 150b of FIG. 15B may be formed at the time t32. Since the input offset voltage of the amplifier A is sampled by the fifth pair of capacitors C5p and C5n, the sampled input offset voltage of the amplifier A may be compensated for in the integration operation.

Figure 16:
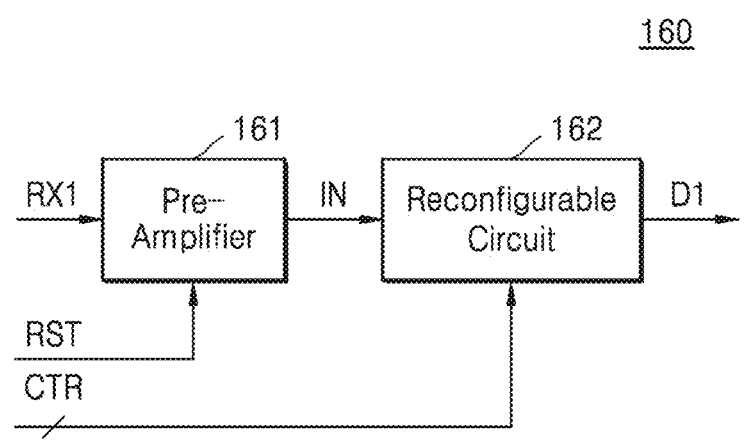
FIG. 16 is a block diagram of a front-end circuit according to an example embodiment.
Figure 17:
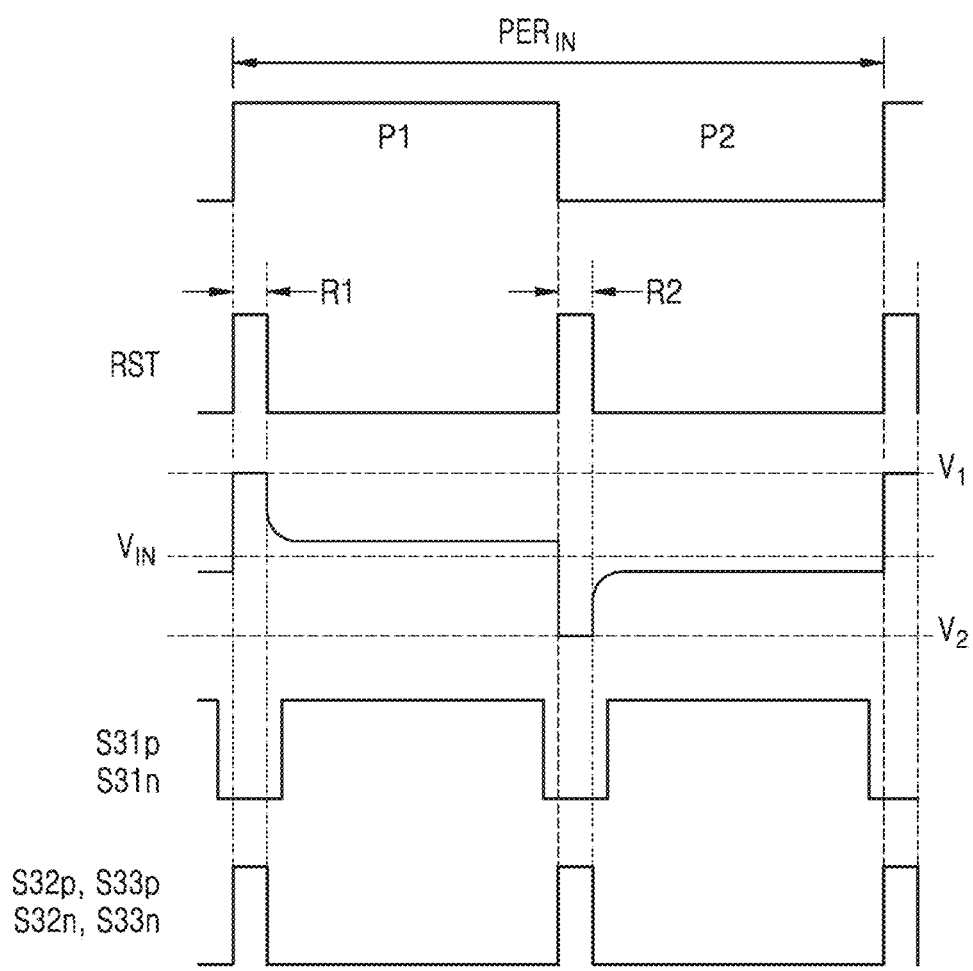
FIG. 17 is a timing diagram showing an example of operation of the front-end circuit of FIG. 16, according to an example embodiment.

FIG. 16 is a block diagram of a front-end circuit 160 according to an example embodiment of the inventive concept, and FIG. 17 is a timing diagram showing an example of operations of the front-end circuit 160 of FIG. 16 according to an example embodiment of the inventive concepts.

Referring to FIGS. 16 and 17, the block diagram of FIG. 16 shows the front-end circuit 160 including a pre-amplifier 161 receiving a reset signal RST and a reconfigurable circuit 162, and the timing diagram of FIG. 17 shows states of the reset signal RST, the input voltage $V_{IN}$, and a plurality of switches S31p to S33p and S31n to S33n during the period $PER_{IN}$ of the input signal IN in the integration period according to time, when the reconfigurable circuit 162 of FIG. 16 corresponds to the reconfigurable circuit 130 of FIG. 13. Hereinafter, descriptions about FIGS. 16 and 17, which are already provided above with reference to FIGS. 13, 14, 15A and 15B, will be omitted.

In some example embodiments, the pre-amplifier 161 may be reset in every phase. For example, the controller 12_1a of FIG. 1A may generate the reset signal RST, as well as the control signal CTR, and the reset signal RST may be activated in a first reset period R1 included in the first phase P1 and in a second reset period R2 included in the second phase P2, as shown in FIG. 17. The pre-amplifier 161 may generate the input signal IN having a variable input voltage $V_{IN}$ in response to the reset signal RST that is deactivated, e.g., in a low level, as described above with reference to the drawings. On the other hand, the pre-amplifier 161 may initialize the input signal IN in response to the reset signal RST that is activated, e.g., in a high level. For example, as shown in FIG. 17, the input voltage $V_{IN}$ may be initialized as a first voltage $V_1$ that is relatively high in the first reset period R1 and as a second voltage V2 that is relatively low in the second reset period R2.

In some example embodiments, the operation of sampling the input offset voltage of the amplifier A may be performed in the reset period in which the input voltage $V_{IN}$ is initialized. For example, as shown in FIG. 17, the switches S31p and S31n may be in turned-off states in a section including the first reset period R1 and the switches S32p, S33p, S32n, and S33n may be in turned-on states in the first reset period R1. Similarly, the switches S31p and S31n may be in turned-off states in a section including the second reset period R2 and the switches S32p, S33p, S32n, and S33n may be in turned-on states in the second reset period R2. Since the input voltage $V_{IN}$ may have a constant level regardless of the touch in the reset period, the input offset voltage of the amplifier A may be accurately sampled.

Figure 18:
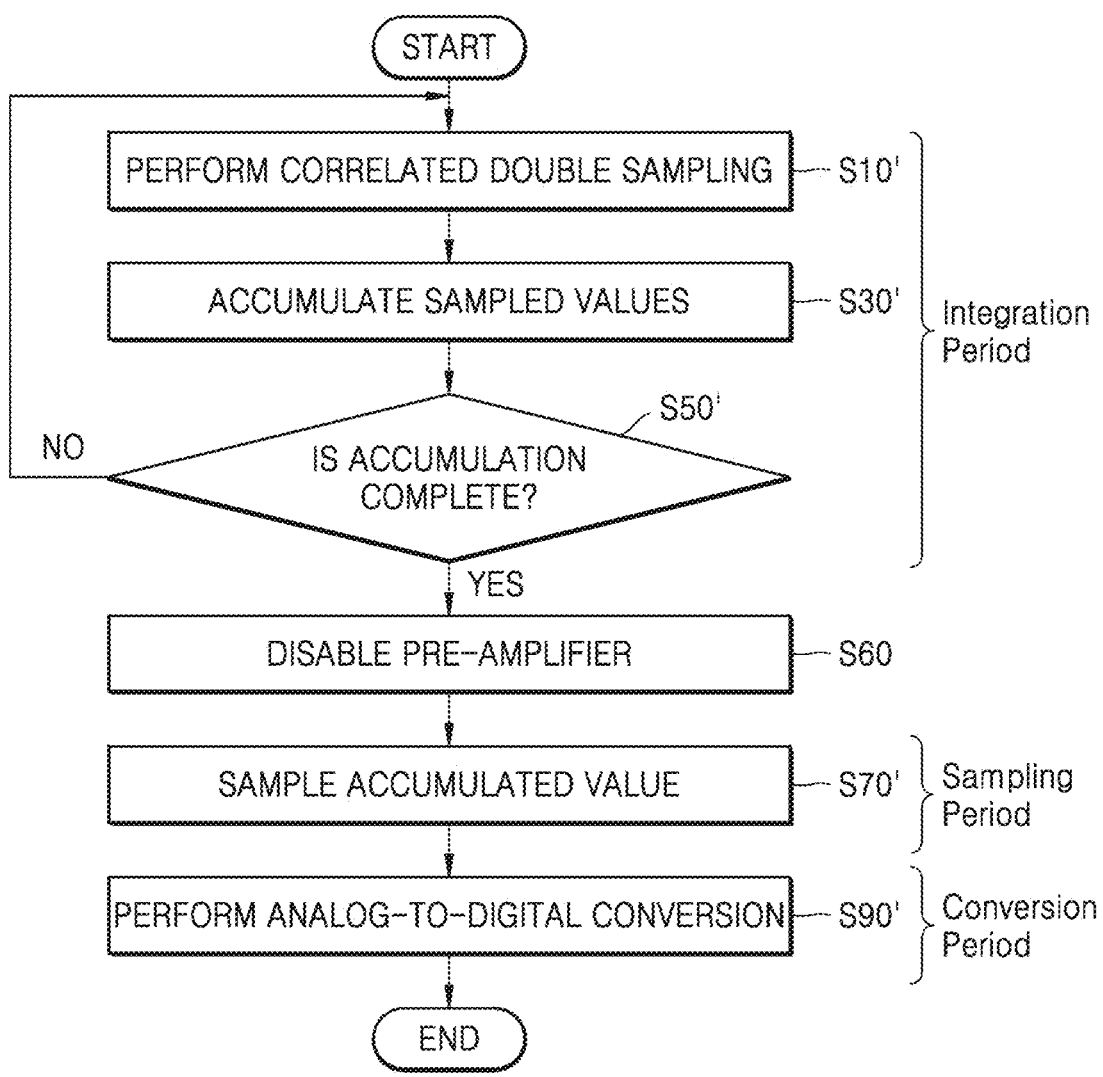
FIG. 18 is a flowchart illustrating an example of operating a touch processing circuit according to an example embodiment.

FIG. 18 is a flowchart illustrating an example of operations of a touch processing circuit according to an example embodiment.

Referring to FIG. 18, similarly to FIG. 5, operations S10', S30', and S50' may be performed in the integration period, operation S70' may be performed in the sampling period, and operation S90' may be performed in the conversion period. Additionally, as shown in FIG. 18, operation S60 may be performed between the integration period and the sampling period. Hereinafter, descriptions about FIG. 18, which are already provided above with reference to FIG. 5, will be omitted, and FIG. 18 will be described with reference to FIGS. 1A and 2.

Referring to FIGS. 1A, 2 and 18, after the integration period, an operation of disabling the pre-amplifier 21 may be performed in operation S60. As described above with reference to the drawings, the input signal IN may not be used in the sampling period and the conversion period following the integration period, and accordingly, the pre-amplifier 21 may be disabled in the sampling period and the conversion period. For example, the controller 12_1a may disable the pre-amplifier 21 by blocking transfer of the input signal IN to the reconfigurable circuit 22 or blocking electric power supplied to the pre-amplifier 21. Accordingly, noise caused by the input signal IN and the pre-amplifier 21 in the sections following the integration period, in particular, in the conversion period, and accuracy of the cyclic analog-to-digital conversion may be improved. In some example embodiments, a circuit generating the plurality of transmission signals TXs of FIG. 1A, in addition to the pre-amplifier 21, may be disabled in operation S60, or the plurality of first channels CH1s may be disabled.

Figure 19:
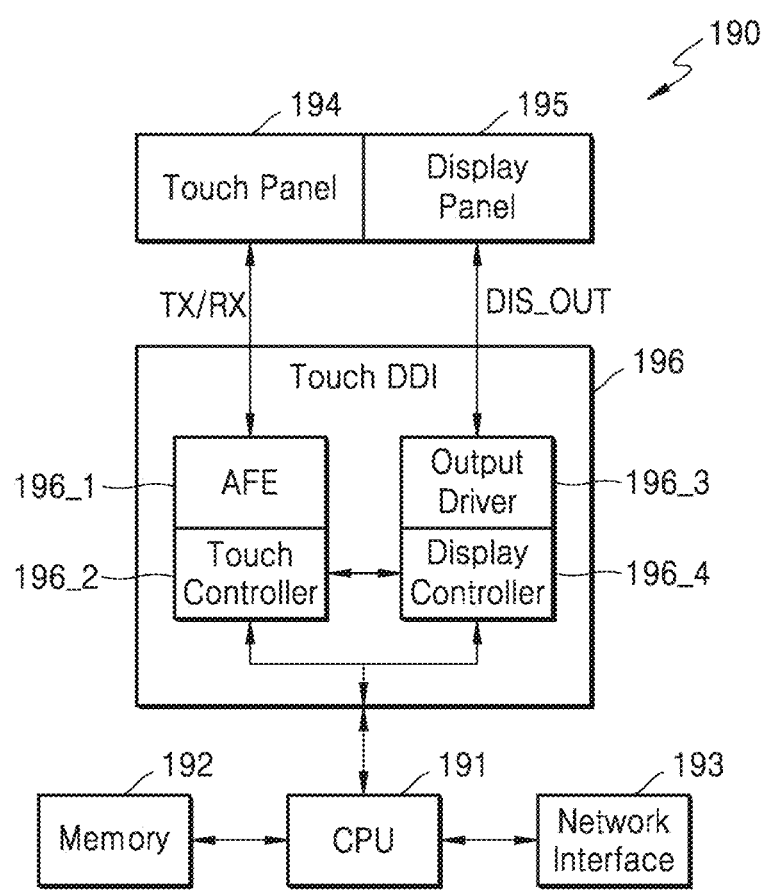
FIG. 19 is a block diagram of a system according to an example embodiment.

FIG. 19 is a block diagram of a system 190 according to an example embodiment.

Referring to FIG. 19, as shown in FIG. 19, the system 190 may include a central processing unit (CPU) 191, a memory 192, a network interface 193, a touch panel 194, a display panel 195, and a touch display driver IC (DDI) 196. In some example embodiments, unlike the example of FIG. 19, the CPU 191 and the other elements of the system 190 may be connected to each other to communicate with each other via a bus.

The CPU 191 may execute instructions stored in the memory 192 or a memory in the CPU 191 to control overall operations of the system 190. For example, the CPU 191 may provide image data to the touch DDI 196, may recognize an external input based on an image output to the display panel 195 and a detected touch, and may perform at least one function set in advance in response to the external input. In some example embodiments, the CPU 191 may be a system-on-chip (SoC) including a processor, a bus, and a functional block, or may be referred to as an application processor (AP).

The memory 192 may be accessed by the CPU 191, and may include non-volatile memory such as electrically erasable programmable read-only memory (EEPROM), flash memory, phase change RAM (PRAM), resistance RAM (RRAM), nano floating gate memory (NFGM), polymer RAM (PoRAM), magnetic RAM (MRAM), ferroelectric RAM (FRAM), etc. or volatile memory such as dynamic RAM (DRAM), static RAM (SRAM), mobile DRAM, double data rate synchronous DRAM (DDR SDRAM), low power DDR (LPDDR) SDRAM, graphic DDR (GDDR) SDRAM, rambus DRAM (RDRAM), etc.

The network interface 193 may provide the CPU 191 with an interface with respect to a network at outside of the system 190. For example, the network interface 193 may access a wired or wireless network, and may transfer a signal transmitted from the network to the CPU 191 or a signal transmitted from the CPU 191 to the network.

The touch DDI 196 may be implemented as at least one chip, e.g., as a single chip formed on a substrate. As shown in FIG. 19, the touch DDI 196 may include an analog front-end 196_1 and a touch controller 196_2 as elements for controlling the touch panel 194, and may include an output driver 196_3 and a display controller 196_4 as elements for controlling the display panel 195. The analog front-end 196_1 and the touch controller 196_2 may be collectively referred to as a touch processing circuit. The touch panel 194 may be arranged on the display panel 195 to transmit light output from the display panel 195, and the touch panel 194 and the display panel 195 may be collectively referred to as a touch screen.

The analog front-end 196_1 may provide a transmission signal TX to the touch panel 194 and may receive a reception signal RX from the touch panel 194. The analog front-end 196_1 may include a plurality of front-end circuits according to an example embodiment of the inventive concepts, and accordingly, the touch may be detected with improved accuracy and reduced costs. The touch controller 196_2 may detect the touch based on a digital signal provided by the analog front-end 196_1 and may provide a signal including information about the touch to the CPU 191.

The display controller 196_4 may convert the image data provided by the CPU 191 into a signal to be displayed on the display panel 195, and the output driver 196_3 may output a display output signal DIS_OUT under the control of the display controller 196_4. As shown in FIG. 19, the display controller 196_4 may communicate with the touch controller 196_2. For example, the display controller 196_4 may provide the touch controller 196_2 with a signal including information about display timing, and the touch controller 196_2 may provide the display controller 196_4 with a signal including information about an operation mode, e.g., information about whether to enter a standby mode.

In some example embodiments, the touch DDI 196 may include a memory accessed by the touch controller 196_2 and/or the display controller 196_4, and may further include a power supply circuit that supplies electric power to the analog front-end 196_1 and the output driver 196_3. Also, in some example embodiments, unlike the example shown in FIG. 19, the touch controller 196_2 and the display controller 196_4 may communicate with the CPU 191 via independent interfaces (e.g., LoSSI, I2C, etc.)

While the inventive concepts have been particularly shown and described with reference to example embodiments thereof, it will be understood that various changes in form and details may be made therein without departing from the spirit and scope of the following claims.

What is claimed is:

1. A front-end circuit configured to process an input signal that varies according to a touch, the front-end circuit comprising:
   a plurality of switches each configured to selectively form a closed circuit;
   an amplifier configured to operate during an integration period, in which a deviation of the input signal between a first phase and a second phase is accumulated as an accumulated deviation, and a conversion period, in which the accumulated deviation is converted into a digital signal during a third phase and a fourth phase;
   a first capacitor configured to sample the input signal by directly receiving the input signal during the integration period and to sample an output voltage of the amplifier by receiving the output voltage directly from the amplifier during the fourth phase of the conversion period, by at least some of the plurality of switches;
   a second capacitor configured to provide a common mode voltage to the amplifier as a virtual ground during the integration period and to function as a feedback capacitor of the amplifier during the third phase and the fourth phase of the conversion period, by at least some of the plurality of switches; and
   a third capacitor configured to function as the feedback capacitor during the integration period and to sample the output voltage by receiving the output voltage directly from the amplifier during the third phase of the conversion period, by at least some of the plurality of switches.

2. The front-end circuit of claim 1, further comprising a fourth capacitor configured to function as the feedback capacitor during the integration period, by at least some of the plurality of switches.

3. The front-end circuit of claim 1, further comprising a fifth capacitor configured to sample an input offset voltage of the amplifier before the first capacitor samples the input signal during the integration period, by at least some of the plurality of switches.

4. The front-end circuit of claim 1, further comprising:
   a comparator configured to compare the output voltage with at least one reference level; and
   a digital-to-analog converter configured to output a reference voltage having a level that varies according to an output signal of the comparator, wherein,
   the amplifier, the first capacitor, the second capacitor, the third capacitor, the comparator, and the digital-to-analog converter are configured to operate as cyclic analog-to-digital converters during the conversion period, by at least some of the plurality of switches.

5. The front-end circuit of claim 1, wherein the first capacitor, the second capacitor, and the third capacitor have a same capacitance.

6. A touch processing circuit comprising:
   a front-end circuit including an amplifier, a first capacitor, a second capacitor, a third capacitor, and a plurality of switches each configured to selectively form a closed circuit to reconfigure the front-end circuit between three different circuits in three periods, respectively, the three periods sequentially being an integration period, a sampling period, and a conversion period, the front-end circuit being configured to process an input signal that varies according to a touch; and
   a controller configured to control the plurality of switches, such that the front-end circuit is configured as,
      a first circuit of the three different circuits to accumulate a deviation of the input signal between a first phase and a second phase as an accumulated deviation during the integration period,
      a second circuit of the three different circuits to convert the accumulated deviation into a digital signal during the conversion period by controlling the plurality of switches such that, in the second circuit, an output of the amplifier is directly connected to the first capacitor during one phase of two phases included in the conversion period, and
      a third circuit of the three different circuits to sample the accumulated deviation during the sampling period by controlling the plurality of switches such that, in the third circuit, the output of the amplifier is directly connected to the first capacitor.

7. The touch processing circuit of claim 6, wherein the controller is configured to control the plurality of switches during the integration period such that,
   the first capacitor samples the input signal in the first phase or the second phase,
   the second capacitor provides a common mode voltage of the amplifier as a virtual ground in the first phase and the second phase, and
   the third capacitor functions as a feedback capacitor of the amplifier.

8. The touch processing circuit of claim 7, further comprising:
   a fourth capacitor,
      wherein the controller is configured to control the plurality of switches during the integration period such that that the fourth capacitor functions as the feedback capacitor of the amplifier during the integration period.

9. The touch processing circuit of claim 7, further comprising:
   a fifth capacitor,
      wherein the controller is configured to control the plurality of switches during the integration period such that that the fifth capacitor samples an input offset voltage of the amplifier before the first capacitor samples the input signal during the integration period.

10. The touch processing circuit of claim 9, wherein
    the first phase and the second phase each include a reset period in which the input signal is initialized, and
    the controller is configured to control the plurality of switches during the reset period such that that the fifth capacitor samples the input offset voltage during the reset period.

11. The touch processing circuit of claim 6, wherein the front-end circuit comprises:
    a comparator configured to compare an output voltage of the amplifier with a voltage level of a reference voltage; and a digital-to-analog converter configured to output the reference voltage such that the voltage level of the reference voltage varies according to an output signal of the comparator,
 wherein the second circuit is configured to operate as a cyclic analog-to-digital converter including the comparator and the digital-to-analog converter.

12. The touch processing circuit of claim 11, wherein the controller is configured to control the plurality of switches during the conversion period such that the output voltage and the reference voltage are alternately applied to the first capacitor and the third capacitor, and the second capacitor functions as a feedback capacitor of the amplifier.

13. The touch processing circuit of claim 11, wherein the controller is configured to control the plurality of switches during the conversion period such that the cyclic analog-to-digital converter operates with a period different from a period including the first phase and the second phase of the input signal.

14. The touch processing circuit of claim 6, wherein the controller is configured to control the plurality of switches during the sampling period such that that the first capacitor and the third capacitor sample the accumulated deviation during the sampling period, and the second capacitor functions as a feedback capacitor of the amplifier during the sampling period.

15. The touch processing circuit of claim 6, wherein
 the front-end circuit further includes a pre-amplifier configured to generate the input signal based on a variation in a capacitance according to the touch, and
 the controller is configured to disable the pre-amplifier during the conversion period.

16. The touch processing circuit of claim 6, wherein
 the first capacitor, the second capacitor, and the third capacitor have a same capacitance.

17. The touch processing circuit of claim 6, further comprising
 a plurality of front-end circuits connected to a sensor array through a plurality of reception channels, respectively, the sensor array configured to provide a capacitance which varies according to the touch,
 wherein the controller is configured to control the plurality of front-end circuits.

18. A touch processing circuit configured to detect a touch based on a capacitance that varies according to the touch, the touch processing circuit comprising:
 a front-end circuit including an amplifier, a first capacitor, a second capacitor, a third capacitor and a plurality of switches, the front-end circuit configured to,
  generate an input signal based on a variation in the capacitance,
  accumulate deviations of the input signal between a first phase and a second phase as an accumulated deviation during a integration period, and
  convert the accumulated deviation into a digital signal during a third phase and a fourth phase of a conversion period; and
 a controller configured to control the plurality of switches such that the amplifier, the first capacitor, the second capacitor, and the third capacitor are operating in the integration period and the conversion period,
  wherein the controller is configured to control at least one of the plurality of switches such that the first capacitor samples the input signal by directly receiving the input signal during the integration period and samples an output voltage of the amplifier by receiving the output voltage directly from the amplifier during the fourth phase of the conversion period.

19. The touch processing circuit of claim 18, wherein the front-end circuit comprises:
 a comparator configured to compare an output voltage of the amplifier with a voltage level of a reference voltage; and
 a digital-to-analog converter configured to output the reference voltage such that the voltage level of the reference voltage varies according to an output signal of the comparator,
  wherein the front-end circuit is configured to operate as a cyclic analog-to-digital converter including the comparator and the digital-to-analog converter.

* * * * *